United States Patent [19]
Yokota et al.

[11] Patent Number: 5,619,048
[45] Date of Patent: *Apr. 8, 1997

[54] SEMICONDUCTOR INTEGRATED CIRCUIT DEVICE

[75] Inventors: Miho Yokota; Masatomi Okabe, both of Itami, Japan

[73] Assignee: Mitsubishi Denki Kabushiki Kaisha, Tokyo, Japan

[*] Notice: The term of this patent shall not extend beyond the expiration date of Pat. No. 5,444,276.

[21] Appl. No.: 495,022

[22] Filed: Jun. 27, 1995

Related U.S. Application Data

[63] Continuation of Ser. No. 165,944, Dec. 14, 1993, Pat. No. 5,444,276.

[30] Foreign Application Priority Data

Dec. 18, 1992 [JP] Japan ................................. 4-338615
Aug. 30, 1993 [JP] Japan ................................. 5-214122

[51] Int. Cl.⁶ ............................................. H01L 27/02
[52] U.S. Cl. ...................... 257/207; 257/211; 257/758
[58] Field of Search ............................. 257/207, 211, 257/758, 203, 204

[56] References Cited

U.S. PATENT DOCUMENTS

| | | | |
|---|---|---|---|
| 4,989,062 | 1/1991 | Takahashi et al. | 257/207 |
| 5,095,352 | 3/1992 | Noda et al. | 257/211 |
| 5,119,169 | 6/1992 | Kozono et al. | 257/758 |
| 5,237,184 | 8/1993 | Yonemaru et al. | 257/211 |
| 5,355,004 | 10/1994 | Saitoh | 257/211 |

*Primary Examiner*—Sara W. Crane
*Assistant Examiner*—Alexander Oscar Williams
*Attorney, Agent, or Firm*—Oblon, Spivak, McClelland, Maier & Neustadt, P.C.

[57] ABSTRACT

In order to lay out a driver circuit having high drivability without increasing a semiconductor chip area, a macro cell (22) such as a clock driver having a large fan-out is arranged under a feeder line (20). It is possible to feed the macro cell (22) from the feeder line (20), which is a second layer aluminum wire, in a short distance. An input signal line (23) and an output signal line (24) which are connected to input and output pins of the macro cell (22) are provided in positions not to be in contact with the feeder line (20). Since the macro cell (22) is arranged in a portion of an internal region which is located under the feeder line (20), it is possible to suppress increase of the layout area as well as electromigration caused by feeding to the macro cell (22).

2 Claims, 21 Drawing Sheets

SEMICONDUCTOR INTEGRATED CIRCUIT DEVICE

This is a continuation of application Ser. No. 08/165,944 filed on Dec. 14, 1993 now U.S. Pat. No. 5,444,276.

BACKGROUND OF THE INVENTION

1. Field of the Invention

The present invention relates to a technique for improving the degree of integration of a semiconductor integrated circuit device which is designed/fabricated by automatic arrangement/wiring or the like, and more particularly, it relates to a technique for improving the degree of integration of a semiconductor integrated circuit device which is provided with a driver circuit having high drivability.

2. Description of the Background Art

FIGS. 19(a) and 19(b) illustrate a structure of a macro cell which functions as a clock driver circuit. Referring to FIG. 19(a), numeral 1 denotes a driver circuit for driving a number of cells, symbol A denotes an input pin of the driver circuit 1, and symbols $Y_0$ to $Y_{n-1}$ denote N output pins of the driver circuit 1. The output pin number of this driver circuit 1 is N. When M flip-flops are connected to each of the output pins $Y_0$ to $Y_{n-1}$, for example, the fan-out is M by N.

FIG. 19(b) shows a macro cell which implements the driver circuit 1 shown in FIG. 19(a) and output signal lines thereof. Referring to FIG. 19(b), symbols Q1 to Q4 denote transistors for forming a macro cell implementing an example of the driver circuit 1 having N output pins shown in FIG. 19(a), symbol LA denotes a signal line serving as an input pin of the driver circuit, symbols $LY_0, LY_1, \ldots, LY_{n-2}$ and $LY_{n-1}$ denote signal lines serving as output pins of the driver circuit, numeral 1a denotes a part implementing the function of the driver circuit which is formed by the transistors etc., numeral 2 denotes the macro cell having the function of the driver circuit, numeral 3 denotes a signal line which is connected to drain electrodes of the transistors Q3 and Q4 provided in the part 1a implementing the function of the driver circuit, numeral 4a denotes a source line for supplying the macro cell 2 with a source potential VDD, and numeral 4b denotes a ground line for supplying the macro cell 2 with a ground potential GND. The macro cell 2 operates by potential difference between the source potential VDD and the ground potential GND.

As shown in FIG. 19(b), N output pins $Y_0, Y_1, \ldots, Y_{n-2}$ and $Y_{n-1}$ are connected to the single output signal line 3, respectively, to extract an output of the driver circuit to the exterior of the macro cell 2. In the macro cell 2 for implementing a driver circuit having a large fan-out, the source line 4a and the ground line 4b which are formed by first layer aluminum wires are generally made larger in width than those in an ordinary macro cell.

A semiconductor integrated circuit device employing such a macro cell 2 is now described. FIG. 20(a) is a plan view showing a semiconductor chip for arranging the macro cell. Referring to FIG. 20(a), numeral 5 denotes a semiconductor chip which is provided with a semiconductor integrated circuit, numeral 6 denotes buffer areas which are provided in the peripheries of the semiconductor chip 5 for inputting or outputting power, signals etc. received from the exterior of the semiconductor chip 5, and numeral 7 denotes an internal region which is provided inside the buffer areas 6 of the semiconductor chip 5 for arranging and wiring various cells. In general, terminals for inputting/outputting signals etc. from/to the exterior are mounted on the semiconductor chip 5 by die bonding or the like, and this semiconductor chip 5 is sealed in a package to complete a semiconductor integrated circuit device.

FIG. 20(b) illustrates a part of the internal region 7 in an enlarged manner. An upper column 8a is a transistor column formed by a plurality of P-channel MOS transistors which are aligned with each other, and a lower column 8b is a transistor column formed by a plurality of N-channel MOS transistors which are aligned with each other. Numeral 8c denotes gate electrodes of P-channel MOS transistors, numeral 8d denotes diffusion areas serving as sources or drains of the P-channel MOS transistors, numeral 8e denotes gate electrodes of the N-channel MOS transistors, and numeral 8f denotes diffusion areas serving as sources or drains of the N-channel MOS transistors. It is possible to obtain a macro cell having various functions by connecting the gate electrodes 8c and 8e and the diffusion areas 8d and 8f using wiring layers provided on the semiconductor chip 5 and carrying out wiring within the cells.

FIG. 21(a) is a plan view showing the macro cell 2 in the semiconductor chip 5, appearing in FIG. 19(b), which is provided with a source line for feeding the macro cell 2, and a ground line. Referring to FIG. 21(a), numeral 9 denotes a macro cell column of the internal region 7 which is provided with the macro cell 2 numeral 10a denotes source lines which are formed by second layer aluminum wires, numeral 10b denotes feeding ground lines which are formed by second layer aluminum wires, numeral 11 denotes first layer aluminum wires for connecting the macro cell 2 with respective cells, and numeral 12 denotes the cells which are driven by the macro cell 2. FIG. 21(b) illustrates a part of the internal region 7 in an enlarged manner.

In general, the source line 4a and the ground line 4b provided in the macro cell 2 having the function of a large fan-out driver circuit or the like are arranged to be directly connected with the source and ground lines 10a and 10b, to cause no electromigration of the output signal lines. Further, the same numbers of cells 12 to be driven are generally connected to the N output pins of the macro cell 2 to reduce difference in load capacitance and resistance between the N output pins, thereby facilitating a layout for reducing skews between the output pins.

In the conventional semiconductor integrated circuit device having the aforementioned structure, however, the source line 4a and the ground line 4b of the large fan-out macro cell 2 provided along the macro cell column which is formed by the first layer aluminum wires must be made larger in width than those in other macro cells. Therefore, the area of the semiconductor chip 5 is increased, for example, such that all macro cell columns between a plurality of feeder lines which are formed by source lines 10a and ground lines 10b are employed.

SUMMARY OF THE INVENTION

According to the present invention, a semiconductor integrated circuit device comprises a plurality of transistors which are regularly arranged on a semiconductor substrate, at least a set of first and second source lines which are provided in a first wiring layer for supplying the plurality of transistors with voltages for driving the transistors, third and fourth source lines, which are larger in width than the first and second source lines, arranged in a second wiring layer, which is different from the first wiring layer, in alignment with each other to intersect with the first and second source lines in a grade separation manner, and at least one macro cell utilizing those of the transistors which are located under the third and fourth source lines or under a region held between the third and fourth source lines.

Preferably, the plurality of transistors include MOS transistors.

Preferably, the plurality of transistors which are regularly arranged on the semiconductor substrate include gate array.

Preferably, the first and second source lines include first and second source lines which are provided along a line of the transistors arranged in the line.

According to the present invention, the macro cell is arranged on a region under the third and fourth source lines, which has been unused in general, whereby no loss is caused in arrangement of the macro cell.

Then the internal region can be effectively utilized to reduce the area of the semiconductor chip forming the semiconductor integrated circuit.

In a first aspect of the present invention, the semiconductor integrated circuit device further comprises an output signal line which is provided in a portion of the second wiring layer between the third and fourth source lines for transmitting an output signal of the macro cell.

Preferably, the output signal line includes a clock signal line for distributing clocks.

Preferably, the semiconductor integrated circuit device further comprises an input signal line which is provided in a portion of the second wiring layer between the third and fourth source lines for transmitting an input signal to the macro cell.

Preferably, the input signal line includes a clock signal line for distributing clocks.

According to the present invention, the output line is provided between the third and fourth source lines, whereby it is possible to shield a noise which is caused by an output signal of the macro cell.

Then it is possible to shield a noise by the third and fourth source lines for improving reliability of the semiconductor integrated circuit device.

In a second aspect of the present invention, the macro cell includes a driver circuit which is provided at least on a substantially central portion in relation to the overall lengths of the third and fourth source lines.

Preferably, the driver circuit includes a main driver circuit for distributing a clock signal to another macro cell which is formed through the transistors on the semiconductor substrate.

Preferably, the driver circuit comprises a plurality of inverter circuits, each of which is formed by a single P-channel MOS transistor and a single N-channel MOS transistor which are connected in series between the first and second source lines, and the inverter circuits are connected in parallel with each other.

According to the present invention, the driver circuit is located on an intermediate portion of the output signal line, whereby it is possible to easily reduce a skew of a signal caused by resistance and capacitance of the output signal line.

Then it is possible to reduce a skew of a signal outputted by the driver circuit.

Preferably, the driver circuit includes a predriver circuit and said macro cell includes two main driver circuits which are provided in portions being separated from both ends of the third and fourth source lines by distances about quarter the overall lengths of the third and fourth source lines respectively.

Preferably, the semiconductor integrated circuit device further comprises an output signal line which is provided in a portion of the second wiring layer between the third and fourth source lines for transmitting an output signal from the predriver circuit to the two main driver circuits.

Preferably, each of the two main driver circuits comprises a plurality of inverter circuits, each of which is formed by a single P-channel MOS transistor and a single N-channel MOS transistor which are connected in series between the first and second source lines respectively, and the inverter circuits are connected in parallel with each other.

Preferably, the semiconductor integrated circuit further comprises other source lines, the predriver circuit comprises a plurality of inverter circuits, each of which is formed by a single P-channel MOS transistor and a single N-channel MOS transistor which are connected in series between the first and second source lines respectively, and the inverter circuits are connected in parallel with each other.

According to the present invention, the two main driver circuits are arranged in portions separated from both ends by distances of about quarter the overall lengths of the third and fourth source lines to be in symmetrical arrangement, whereby it is possible to reduce a skew of a signal caused by resistance and capacitance of the output signal line by interaction of the two main driver circuits.

Then it is possible to reduce a skew of a signal outputted from the driver circuit.

In the third aspect of the present invention, the third and fourth source lines feed the macro cell independently of other source lines.

Preferably, the semiconductor integrated circuit device further comprises an internal region which is located on the semiconductor substrate to be provided with the plurality of transistors, a buffer area which is provided on the semiconductor substrate around the internal region and the fifth and sixth source lines which are connected to the third and fourth lines which are provided on the buffer area to enclose the internal region for supplying source voltages to the third and fourth source lines.

Preferably, the macro cell includes a macro cell serving as a main driver circuit for distributing a clock signal to another macro cell which is formed through the transistors provided on the semiconductor substrate.

According to the present invention, the third and fourth source lines provide no influence by a noise caused by the macro cell to other source and ground lines.

Then it is possible to prevent a noise generated by the macro cell from influencing other cells through the source and ground lines.

In the fourth aspect of the present invention, the macro cell includes a plurality of macro cells, each of which comprises a main driver circuit utilizing the transistors located on a portion under the third and fourth source lines or under a region held between the third and fourth source lines, and the main driver circuits of the plurality of macro cells have inputs which are connected in common, and outputs which are also connected in common.

Preferably, the semiconductor integrated circuit device further comprises an output signal line which is provided in a portion of the second wiring layer between the third and fourth source lines for transmitting output signals of the main driver circuits of the plurality of macro cells.

Preferably, the semiconductor integrated circuit device further comprises an input signal line which is provided in a portion of the second wiring layer between the third and fourth source lines for transmitting input signals in the main driver circuits of the plurality of macro cells.

Preferably, each main driver circuit comprises a plurality of inverter circuits, each of which is formed by a single P-channel MOS transistor and a single N-channel MOS transistor which are connected in series between the first and second source lines respectively, and the inverter circuits are connected in parallel with each other.

According to the present invention, the plurality of macro cells, having respective inputs of the respective main drivers connected in common and respective outputs also connected in common, can serve as a driver circuit having high drivability as a whole. Thus, it is possible to reduce skews of clocks which are distributed from the plurality of macro cells to other cells. Further, the degree of integration can be improved since the transistors located under the third and fourth source lines, or under a region held between the third and fourth source lines, are employed.

Then the main driver circuits can serve as a single main driver through the region located under the third and fourth source lines, for reducing a skew of a signal outputted from the driver circuit.

Accordingly, an object of the present invention is to provide a semiconductor integrated circuit device provided with a driver circuit having high drivability, which is easy to lay out, without increasing the semiconductor chip area thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
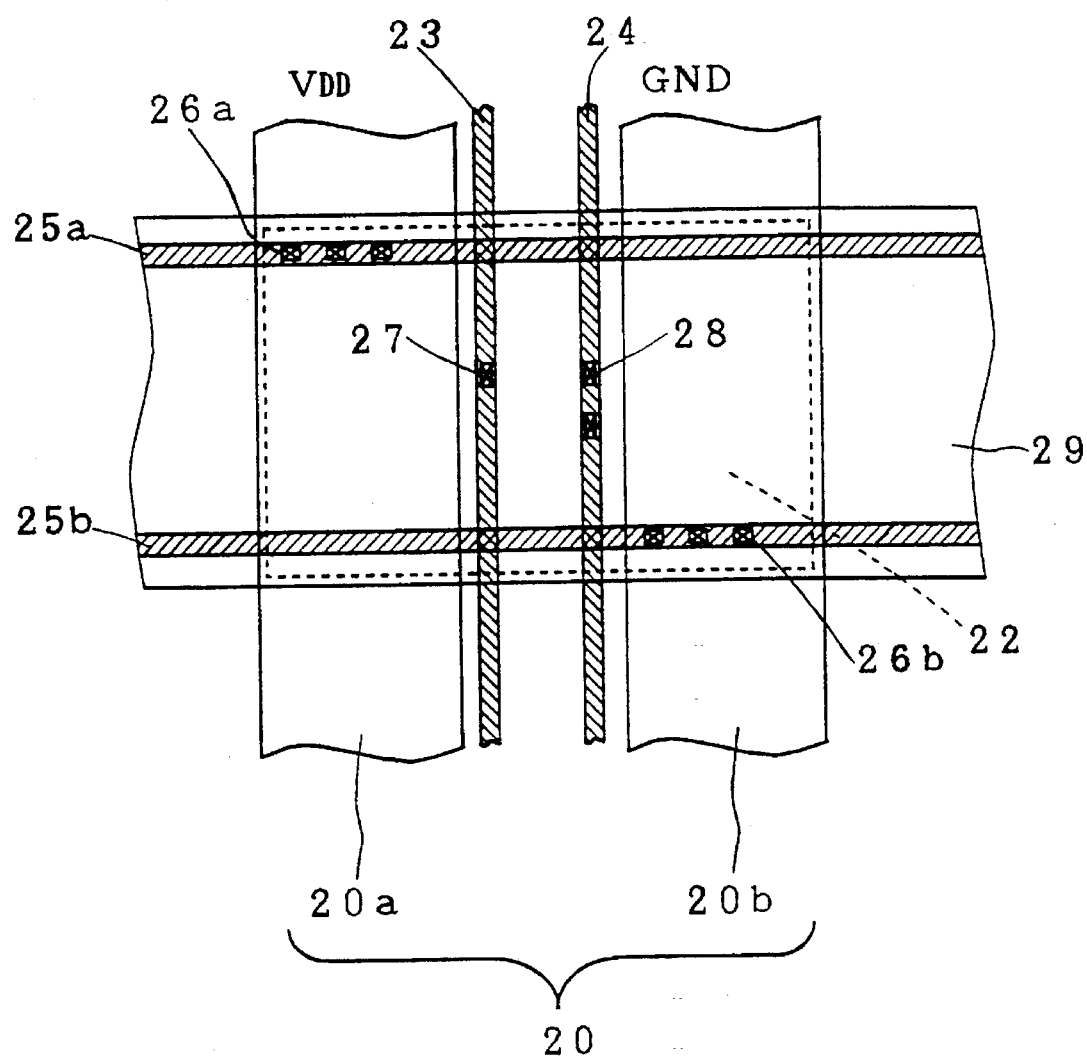
FIG. 1 is a perspective plan view for illustrating a structure of a semiconductor integrated circuit device according to a first embodiment of the present invention.

A first embodiment of the present invention is now described with reference to the drawings. FIG. 1 is a perspective plan view showing a portion where source and ground lines of a semiconductor integrated circuit device according to the first embodiment of the present invention intersect with a macro cell column in a grade separation manner. The semiconductor integrated circuit device has a first layer aluminum wire which is formed on an internal region, and second layer aluminum wires which are formed on the first layer aluminum wire. In order to clarify the relation therebetween, FIG. 1 perspectively illustrates the semiconductor integrated circuit device as viewed from above.

Referring to FIG. 1, numeral 29 denotes a macro cell column which is formed on an internal region of a semiconductor chip, numeral 20 denotes a feeder line which is formed by a source line 20$a$ and a ground line 20$b$ for supplying the macro cell column 29 etc. with a source potential VDD and a ground potential GND respectively, numeral 22 denotes a macro cell having a function of a driver circuit or the like which is arranged under the feeder line 20, numeral 23 denotes an input signal line which is connected with the macro cell 22 by a through hole 27 for inputting a signal in the macro cell 22, numeral 24 denotes an output signal line which is connected with the macro cell 22 by through holes 28 for outputting a signal from the macro cell 22, numeral 25a denotes a source line which is connected with the source line 20a by through holes 26a for supplying the macro cell 22 with the source potential VDD, and numeral 25b denotes a ground line which is connected with the ground line 20b by through holes 26b for supplying the macro cell 22 with the ground potential GND. In general, the source line 20a and the ground line 20b are formed by second layer aluminum wires. The source line 20a and the ground line 20b are perpendicular to the macro cell column.

In general, portions located under the feeder line 20 are indiscriminately inhibited from arrangement for simplifying an algorithm of an automatic arrangement/wiring program, so that no elements are arranged on the portions of the macro cell column 29, which is provided on the surface of the internal region, intersecting with the feeder line 20 in a grade separation manner. In an automatic arrangement/wiring program which is employed for designing the semiconductor integrated circuit device according to the first embodiment, it is possible to easily lay out the elements through the automatic wiring program by enabling arrangement on the portions of the macro cell column 29 intersecting with the feeder line 20 in a grade separation manner for allowing pattern recognition of the second layer aluminum wires of the feeder line 20, thereby arranging the input signal line 23 and the output signal line 24, which are connected to the input and output pins of the macro cell 22 respectively, not to short with the feeder line 20.

The input and output signal lines 23 and 24, which are connected with the input and output pins of the macro cell 22, are arranged between the source line 20a and the ground line 20b in parallel with these lines 20a and 20b. The input and output signal lines 23 and 24 connected with the input and output pins are also second layer aluminum wires similarly to the feeder line 20, and are connected to the macro cell 22 by the through holes 27 and 28.

It is possible to feed the portions of the macro cell 22, which are arranged under the feeder line 20, from the feeder line 20. As shown in FIG. 1, the macro cell 22 is arranged under the feeder line 20 to facilitate feeding thereof, whereby it is possible to feed the first layer aluminum wire, which runs in parallel with the macro cell column 29, in a short distance.

Figure 2:
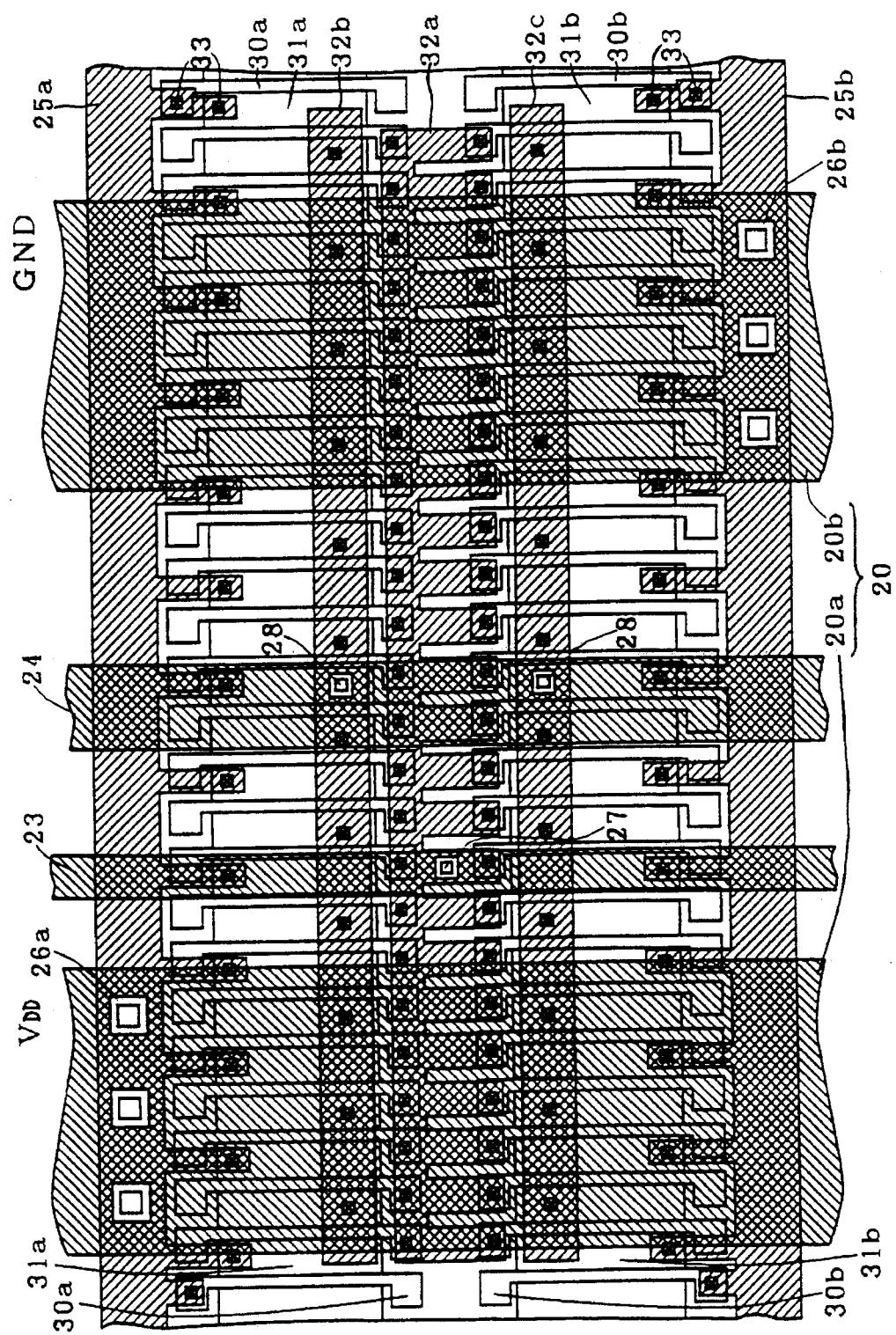
FIG. 2 is a perspective view showing a pattern layout of a macro cell according to the first embodiment of the present invention.

A driver circuit having high drivability is now illustrated as an example of the macro cell 22 shown in FIG. 1. FIG. 2 is a perspective plan view showing a pattern layout of a macro cell having a function of a driver circuit, which is formed by transistors provided under a feeder line.

Referring to FIG. 2, numeral 30a denotes gate electrodes of P-channel MOS transistors, numeral 31a denotes diffusion areas serving as sources or drains of the P-channel MOS transistors, numeral 30b denotes gate electrodes of N-channel MOS transistors, numeral 31b denotes diffusion areas serving as sources or drains of N-channel MOS transistors, numerals 32a to 32c denote first layer aluminum wires which are provided between second aluminum wires such as a feeder line 20 and portions of an internal region provided with the transistors etc., numeral 33 denotes contact holes for connecting electrodes of the transistors provided on the internal region and the first aluminum wires, numeral 26a denotes through holes for connecting a source line 20a of a second aluminum wire with a source line 25a of a first aluminum wire, numeral 26b denotes through holes for connecting a ground line 20b of a second layer aluminum wire with a ground line 25b of a first layer aluminum wire, numeral 27 denotes through holes for connecting the first layer aluminum wire 32a, connecting the gate electrodes of the P-channel and N-channel transistors with each other, with an input signal line 23 of a second layer aluminum wire, and numeral 28 denotes through holes for connecting the first layer aluminum wire 32b, connecting the drains of the P-channel transistors, or the first layer aluminum wire 32b, connecting the drains of the N-channel transistors, with an output signal line 24 of a second layer aluminum wire.

As understood from FIG. 2 the P-channel and N-channel MOS transistors which are formed on portions of the internal region located under the source line 20a and the ground line 20b also form the driver circuit. Thus, the portions located under the source line 20a and the ground line 20b can also be employed for improving the degree of integration.

Figure 3:
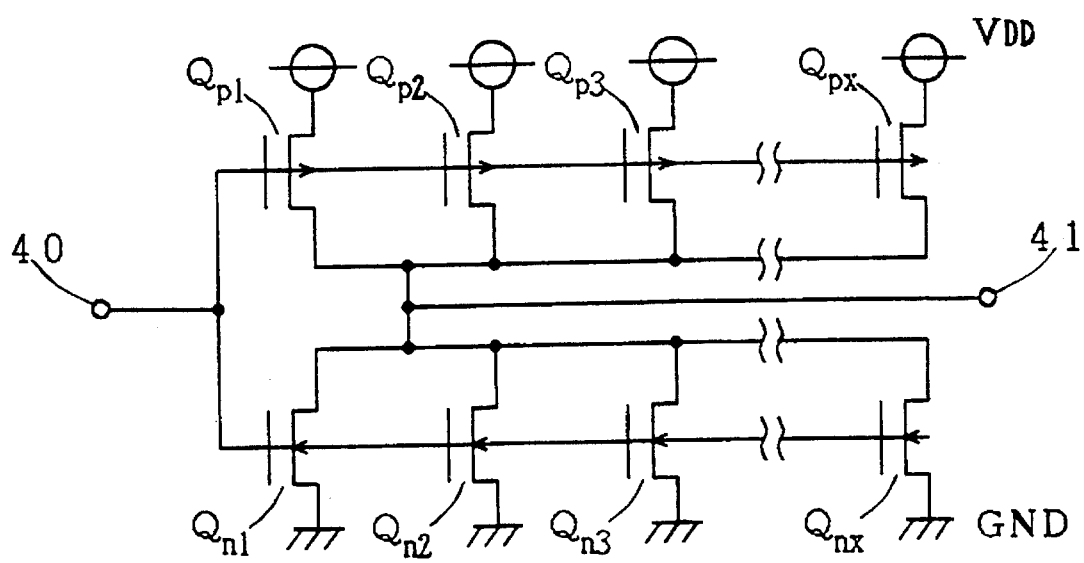
FIG. 3 is a circuit diagram showing the structure of the macro cell according to the first embodiment of the present invention.

FIG. 3 is a circuit diagram of the macro cell 22 shown in FIG. 2. Referring to FIG. 3, numeral 40 denotes an input terminal, numeral 41 denotes an output terminal, symbols $Q_{p1}$ to $Q_{px}$ denote P-channel MOS transistors having gates which are connected to the input terminal 40, drains which are connected to the output terminal 41, and sources which are connected to the source potential VDD, and symbols $Q_{n1}$ to $Q_{nx}$ denote N-channel MOS transistors having gates which are connected to the input terminal 40, drains which are connected to the output terminal 41, and sources which are connected to the ground potential GND. The input terminal 40 corresponds to the input signal line 23 shown in FIG. 23 and the through holes 27 connecting the first layer aluminum wire 32a, while the output terminal 41 corresponds to the output signal line 24 shown in FIG. 2 and the through holes 28 connecting the first layer aluminum wires 32b and 32c to the output signal line 24. The driver circuit shown in FIG. 3 is in such a structure that a plurality of CMOS inverters, each of which is formed by P-channel and N-channel MOS transistors connected in series between the source potential VDD and the ground potential GND, are connected in parallel with each other.

Figure 4:
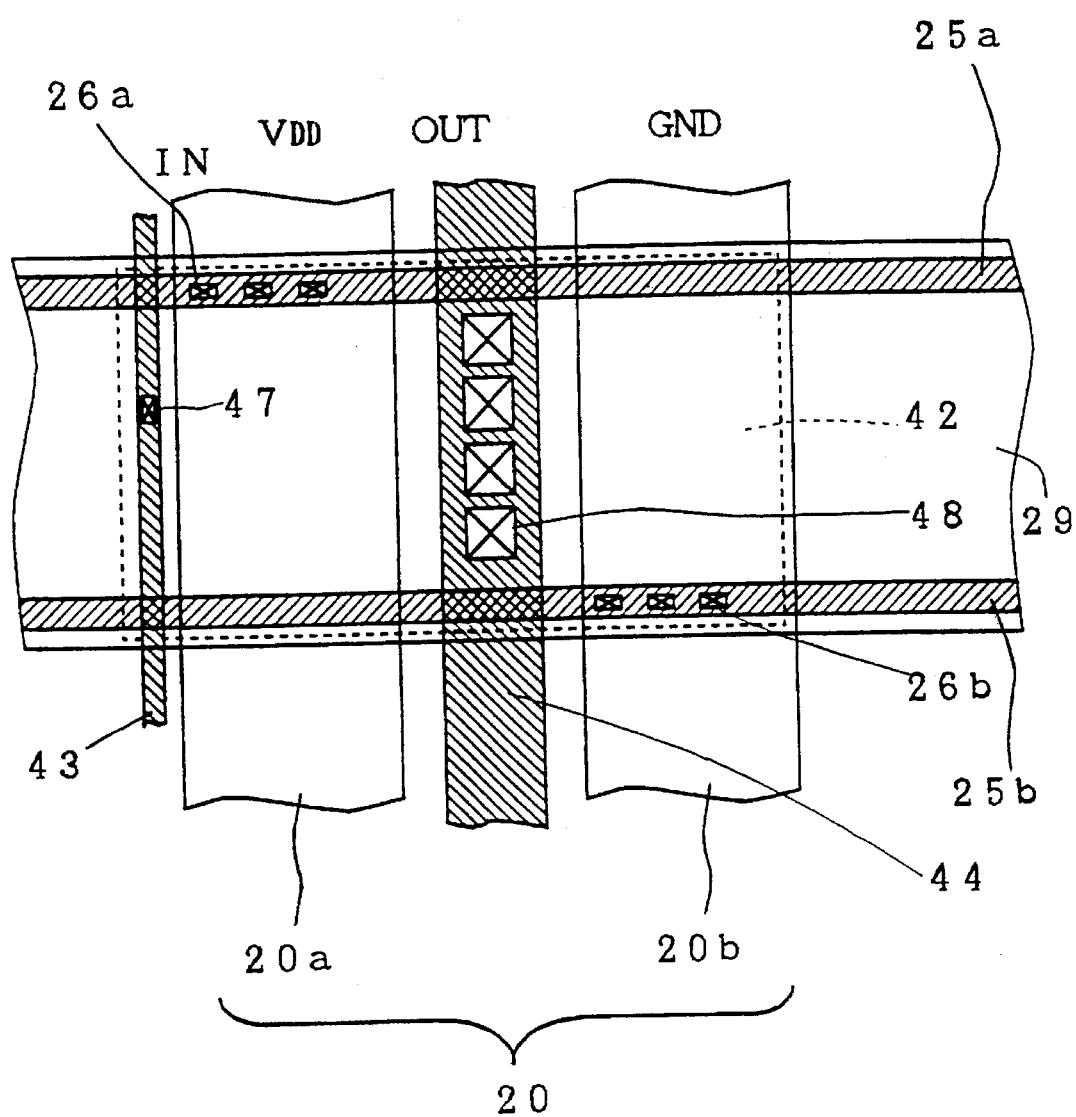
FIG. 4 is a perspective plan view for illustrating a structure of a semiconductor integrated circuit according to a second embodiment of the present invention.
Figure 5:
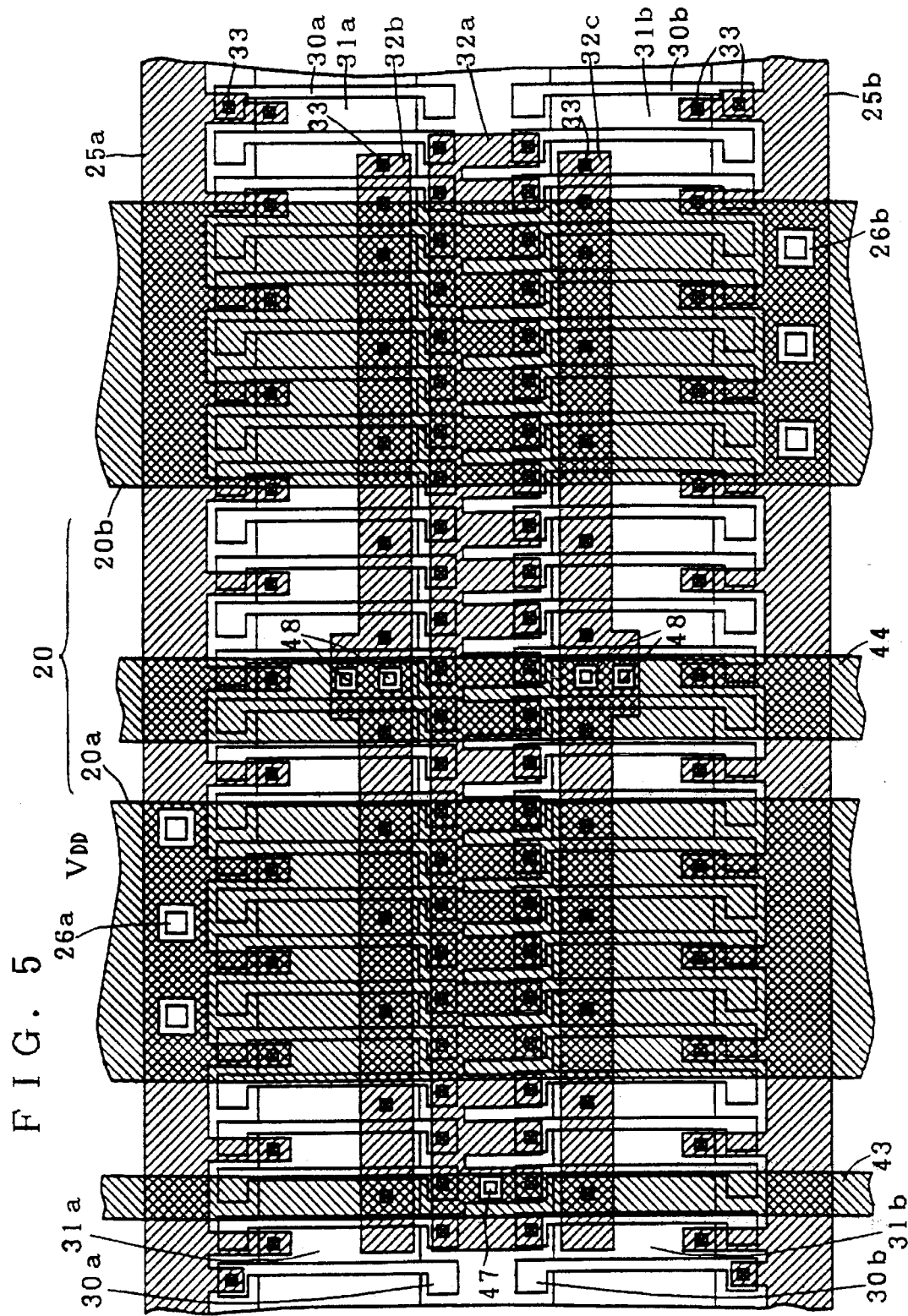
FIG. 5 is a perspective plan view showing a pattern layout of a macro cell according to the second embodiment of the present invention.
Figure 6:
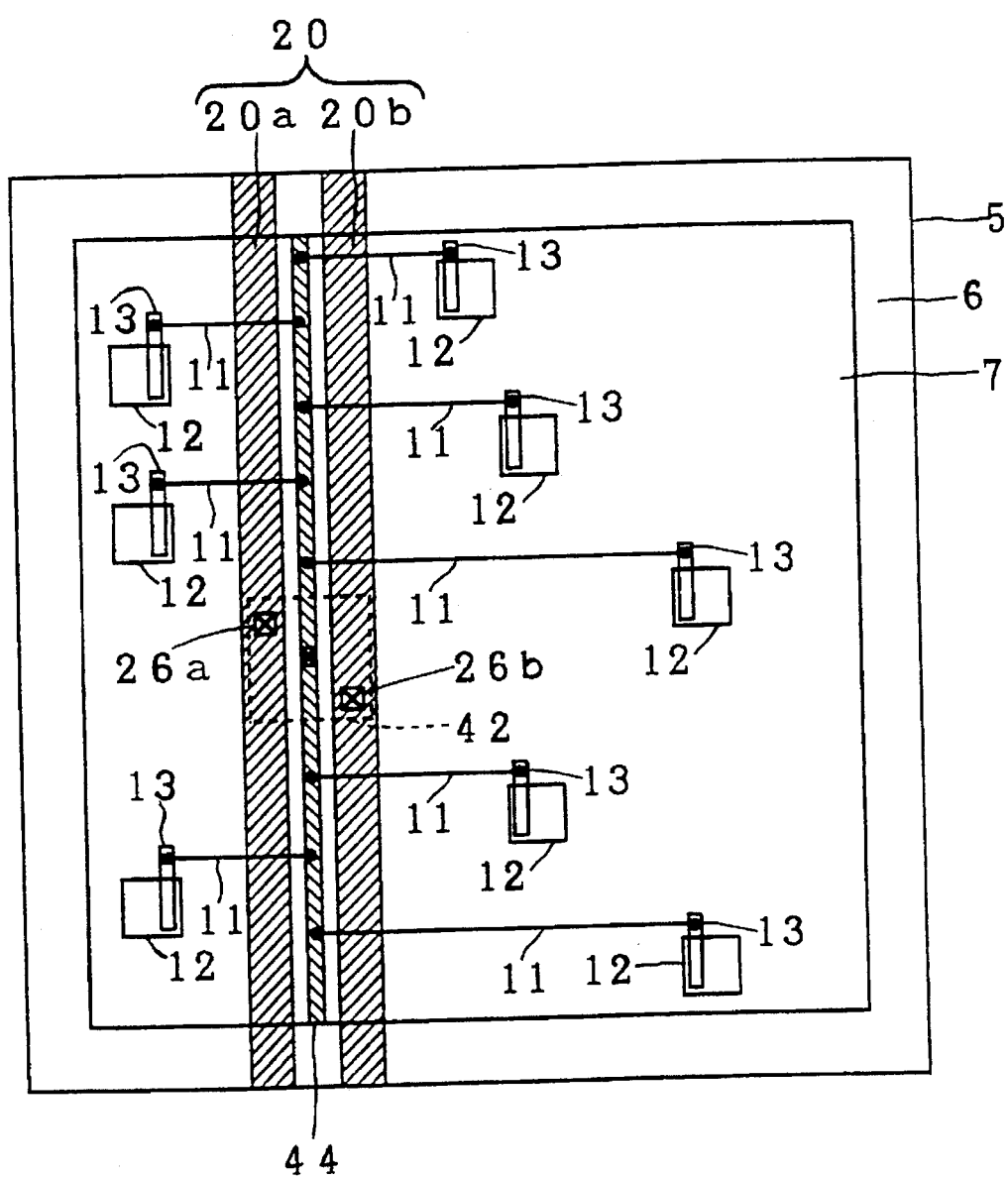
FIG. 6 is a plan view showing connection between the macro cell appearing in FIG. 4 and another macro cell.

Description is now made on a case of arranging a macro cell having high drivability with reference to FIGS. 4 to 6. FIG. 4 is a perspective plan view showing arrangement of a macro cell having a large fan-out and a feeder line. Referring to FIG. 4, numeral 42 denotes a high-drivability macro cell having a large fan-out, and numeral 43 denotes an input signal line which is connected to an input pin of the macro cell 42. The input signal line 43 is provided outside a feeder line 20. Numeral 44 denotes an output signal line which is provided between a source line 20a and a ground line 20b forming the feeder line 20 to be connected to output pins of the macro cell 42, while other numerals identical to those in FIG. 1 denote parts corresponding to those appearing in FIG. 1. The macro cell 42 is provided with a plurality of through holes 48 on its output pins to be connected with the output signal line 44, as a countermeasure for electromigration. In order to cope with electromigration and reduce skews, the output signal line 44 is rendered identical to or in excess of an ordinary second layer aluminum wire in signal line width, to run through the feeder line 20.

FIG. 5 is a perspective plan view showing a pattern layout of a driving circuit having high drivability as an example of the macro cell 42 shown in FIG. 4. Referring to FIG. 5, numeral 47 denotes a through hole which connects a first layer aluminum wire 32a with a second layer aluminum wire 43, and numeral 48 denotes through holes which connect first layer aluminum wires 32b and 32c with the first layer aluminum wire 44, while other numerals identical to those in FIG. 2 denote portions corresponding thereto.

Connection between a macro cell and cells which are driven by the macro cell is now described with reference to FIG. 6. Referring to FIG. 6, numeral 5 denotes a semiconductor chip which is provided with an integrated circuit, numeral 6 denotes a buffer area, numeral 7 denotes an internal region, numeral 20 denotes a feeder line which is formed by a source line 20a and a ground line 20b, numeral 42 denotes a macro cell such as a clock driver having a large fan-out, numeral 12 denotes cells which are driven by the macro cell 42, numeral 11 denotes signal lines of first layer aluminun wires which are connected to an input pin of the cells 12 and an output pin of the macro cell 42, and numeral 13 denotes signal lines of second layer aluminum wires connecting an output signal lines 11 with the input pins of the cells 12, respectively.

The macro cell 42 is fed by the feeder line 20 which is located immediately above the same via the through holes 26a and 26b. Thus, no electromigration is caused even if multi-output driving is carried out, due to such an electromigration countermeasure. Further, the output signal line 44, which is shielded by the source line 20a and the ground line 20b, has a noise reduction effect.

Figure 7:
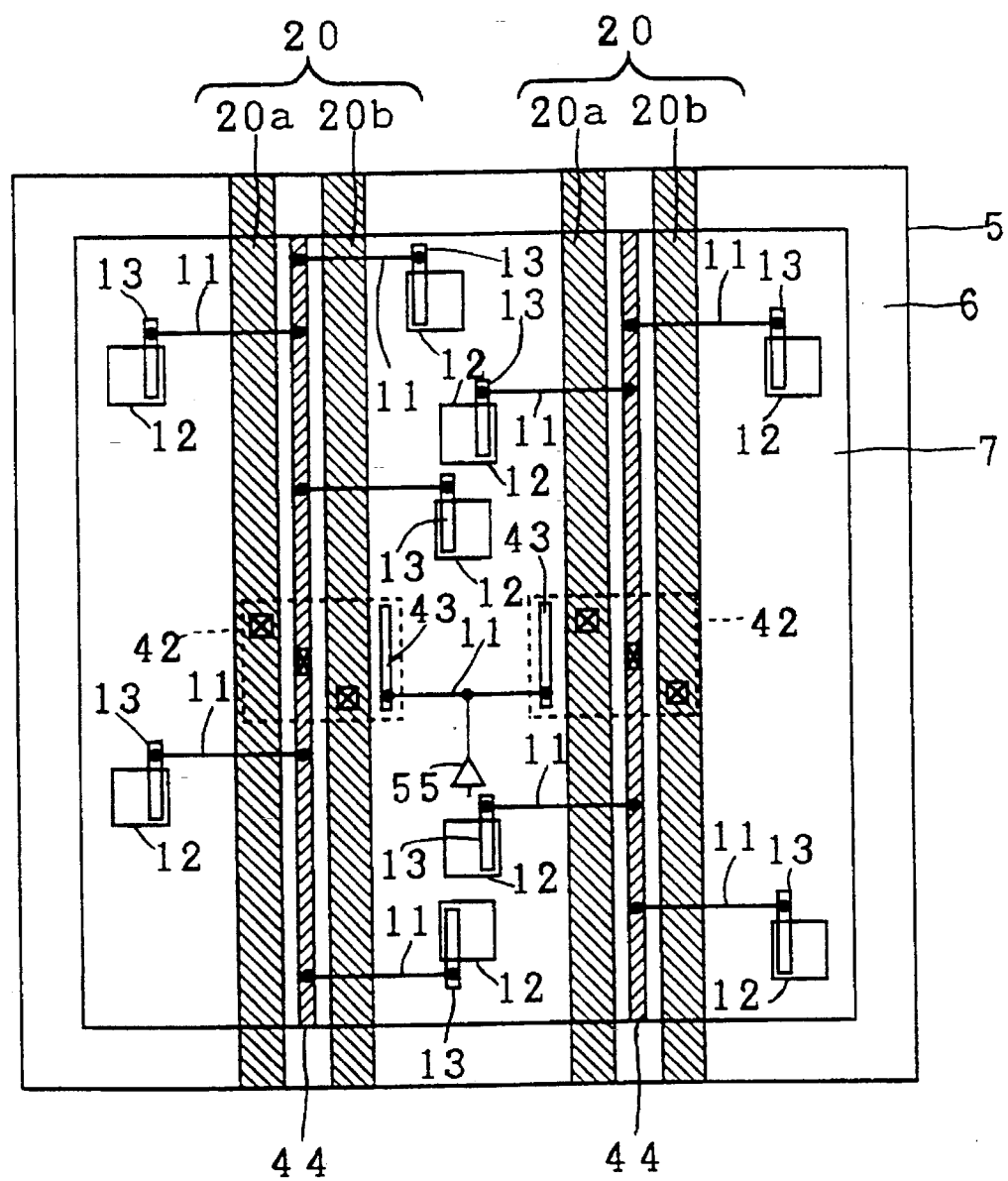
FIG. 7 is a plan view showing arrangement of a plurality of macro cells having large fan-outs according to a third embodiment of the present invention.

Description is now made on a case of supplying clocks using one predriver and two main drivers, with reference to FIG. 7. Referring to FIG. 7, numeral 55 denotes a predriver circuit which supplies clocks to two macro cells 42 provided with main driver circuits, and other numerals identical to those in FIG. 6 denote corresponding or equivalent portions. The two macro cells 42 are fed by two feeder lines 20 respectively, while the predriver circuit 55 supplies clocks to input pins 43 thereof through signal lines 11. A macro cell column is arranged on a central portion so that the macro cells 42 are provided immediately under the respective feeder lines 20 for the macro cell column. Thus, it is possible to suppress skews caused by resistance and capacitance of the output signal lines 44 for applying this structure to a medium scale clock driver having a fan-out of about 300 to 2000.

Figure 8:
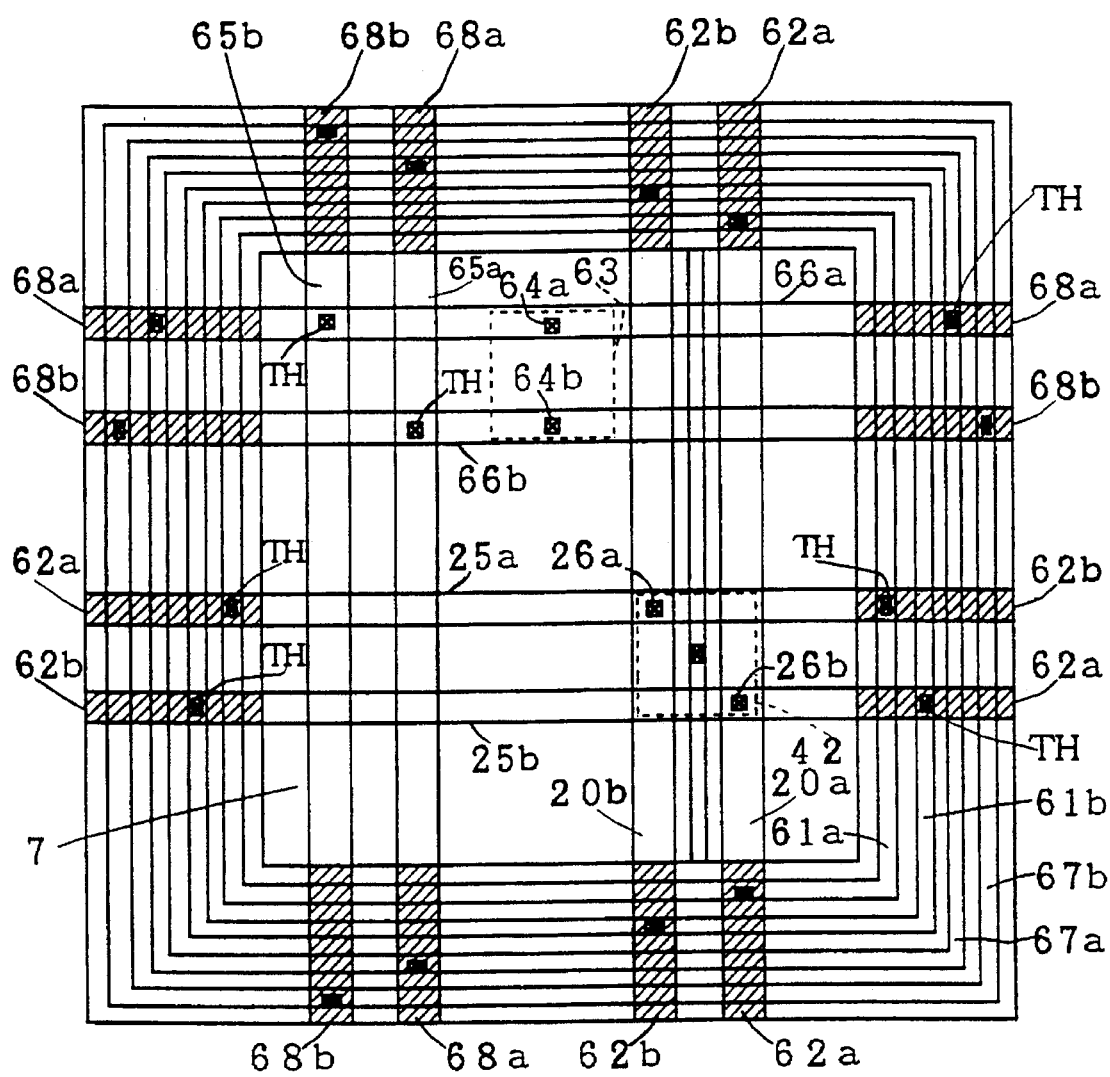
FIG. 8 is a plan view showing a structure of a semiconductor integrated circuit device according to a fourth embodiment of the present invention, in which source lines for feeding different macro cell columns are separated from each other.

Description is now made on a semiconductor integrated circuit device reducing an influence of a noise exerted from a macro cell having a large fan-out to another macro cell, with reference to FIG. 8. Referring to FIG. 8, numeral 42 denotes a macro cell having a large fan-out which is similar to that shown in FIG. 4, numerals 25a and 25b denote first layer aluminum wires for supplying a source potential VDD and a ground potential GND to a macro cell column which is provided with the macro cell 42, numeral 61a denotes a source line which is provided in a buffer area for supplying an internal region 7 with the source potential VDD, numeral 61b denotes a ground line which is provided in the buffer area for supplying the internal region 7 with the ground potential GND, and numerals 62a and 62b showing slanted portions denote clock driver source/ground cells for connecting the first layer aluminum wires 25a and 25b or the source line 20a and the ground line 20b with the source line 61a and the ground line 61b in the buffer area.

The macro cell 42 is supplied in internal transistors forming the same with a source voltage through the first layer aluminum wires (the source line 25a and the ground line 25b). Therefore, the first layer aluminum wires are supplied with a source potential VDD and a ground potential GND from a source line 20a and a ground line 20b via through holes 26a and 26b, as well as a source potential VDD and a ground potential GND from the source line 61a and the ground line 61b which are connected by the clock driver source/ground cells 62a and 62b.

Referring to FIG. 8, further, numeral 63 denotes an ordinary macro cell having a rather small fan-out, numerals 66a and 66b denote a source line and a ground line which are formed by first layer aluminum wires for supplying a source potential VDD and a ground potential GND to a macro cell column provided with the macro cell 63 respectively, numeral 67a denotes a source line which is formed in a buffer area for supplying a source potential VDD to an internal region 7, numeral 67b denotes a ground line which is formed in the buffer area for supplying a ground potential GND to the internal region 7, and numerals 68a and 68b showing slanted portions denote source/ground cells for connecting the first layer aluminum wires 66a and 66b or the source and ground lines 65a and 65b with the source line 67a and the ground line 67b of the buffer area.

The macro cell 63 is supplied in internal transistors forming the same with the source voltage through the first layer aluminum wires 66a and 66b. Therefore, the first layer aluminum wires are supplied with the source potential VDD and the ground potential GND from the source line 65a and the ground line 65b via through holes TH, as well as with the source potential VDD and the ground potential GND from the source line 67a and the ground line 67b which are connected by the ordinary internal cell source/ground cells 68a and 68b.

As shown in FIG. 8, the source line 61a and the ground line 61b for feeding the macro cell column provided with the macro cell 42 which is arranged under the source line 20a and the ground line 20b are separated from the source line 67a and the ground line 67b for feeding the macro cell column provided with the macro cell 63, whereby a noise caused by the macro cell 42 serving as a driver circuit having a large fan-out is not exerted on the other macro cell 63, for effectively improving noise resistance of the semiconductor integrated circuit device.

Figure 9:
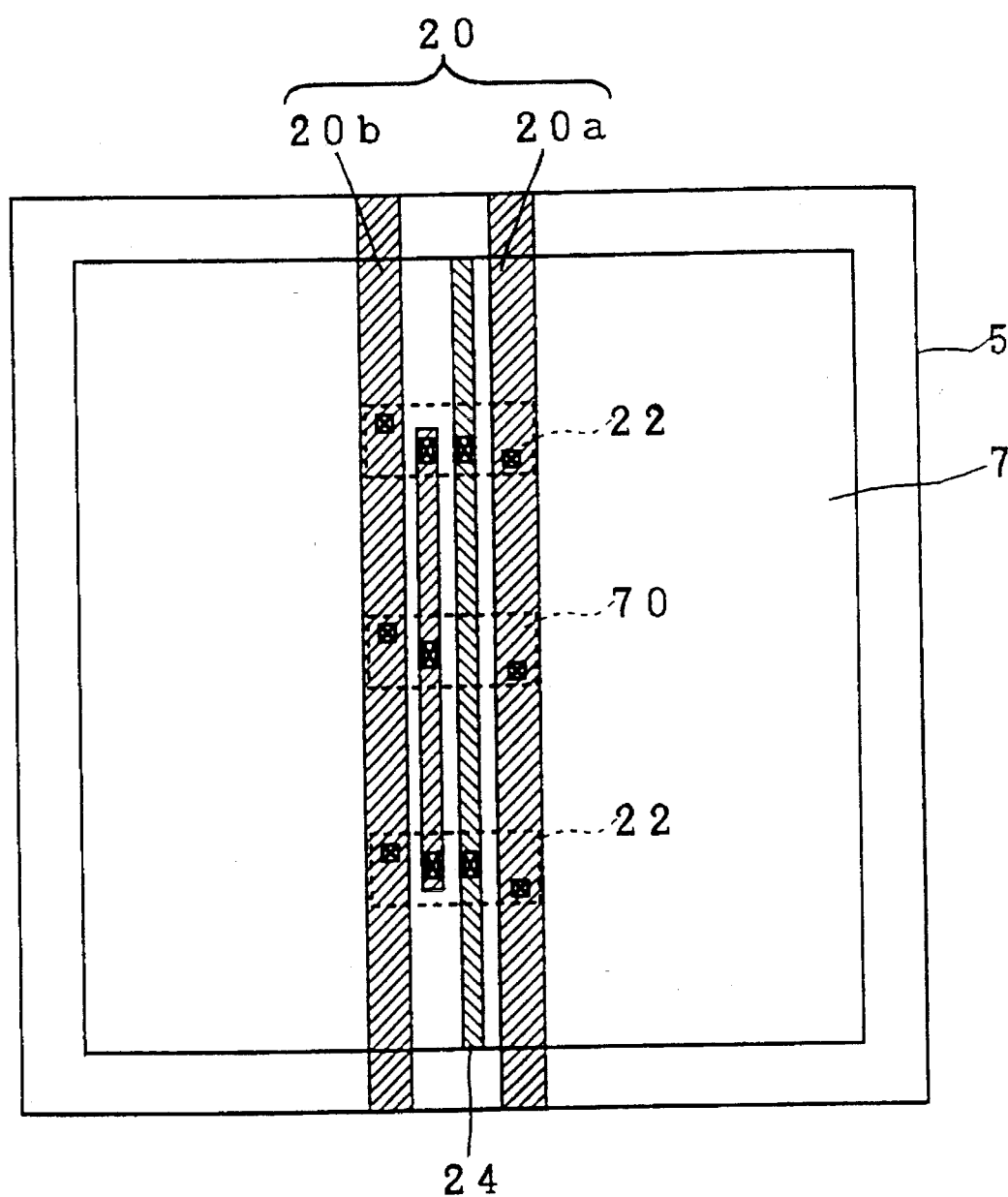
FIG. 9 is a plan view showing a structure of a semiconductor integrated circuit device according to a fifth embodiment of the present invention, utilizing a predriver and main drivers arranged in a plurality of columns.

Description is now made on arrangement of a predriver circuit and main driver circuits for distributing clocks to a plurality of macro cell columns, with reference to FIG. 9. Referring to FIG. 9, numeral 70 denotes a macro cell having a function of a predriver circuit which is arranged on a substantially central position in relation to the overall length of a feeder line 20, and numeral 22 denotes main driver circuits which are arranged on positions separated from both ends of the feeder line 20 by distances about quarter the overall length of the feeder line 20 and supplied with clocks from the macro cell 70 for driving a number of cells.

Thus, a plurality of main driver circuits 22 are arranged on proper positions located under the same feeder line 20 using a plurality of macro cell columns, whereby it is possible to suppress skews caused by resistance and capacitance of output signal lines 24, so that this structure can be applied to a medium scale clock driver circuit having a fan-out of 300 to 2000.

Figure 10:
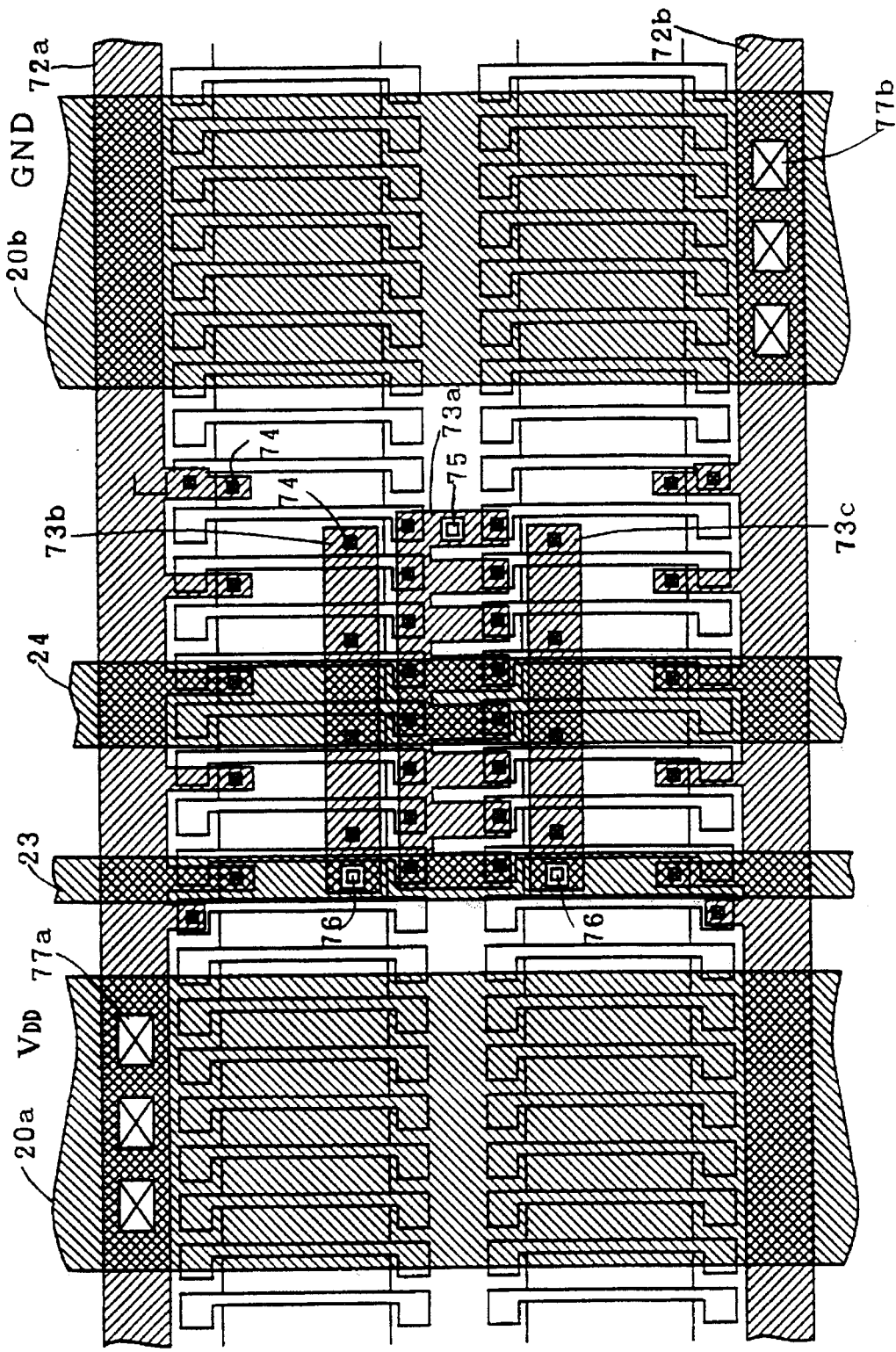
FIG. 10 is a perspective plan view showing a pattern layout of a macro cell according to the fifth embodiment of the present invention.

An exemplary structure of a macro cell 70 which serves as a predriver circuit is shown in FIG. 10. FIG. 10 is a perspective plan view showing a pattern layout of the macro cell 70 serving as a predriver circuit. Referring to FIG. 10, numerals 73a to 73c denote first layer aluminum wires which are provided between a feeder line 20, formed by second layer aluminum wires, and an internal region provided with transistors etc., numeral 74 denotes contact holes which connect electrodes etc. of the transistors provided on the internal region and the first layer aluminum wires, numeral 77a denotes through holes which connect a source line 20a of a second layer aluminum wire and a source line 72a of a first layer aluminum wire, numeral 77b denotes through holes which connect a ground line 20b of a second layer aluminum wire with a ground line 72b of a first layer aluminum wire, numeral 75 denotes a through hole which connects the first layer aluminum wire 73a with an input of the predriver circuit 70, and numeral 76 denotes through holes which connect the first layer aluminum wires 73b and 73c with an input signal line 23 of a second layer aluminum wire.

The first layer aluminum wires 72a, 72b and 73a to 73c are employed to connect the respective transistors, while the second layer aluminum wires 20a, 20b, 23 and 24 are employed to input/output signals in/from the macro cell and supply source voltages to the same. The predriver circuit is formed by connecting eight inverters formed by P-channel MOS transistors and N-channel MOS transistors, which are connected in series between the source potential VDD and the ground potential GND, in parallel with each other.

Since the predriver circuit has a small circuit scale, it may be possible to form such a predriver circuit using transistors provided only on a portion of the internal region which is located under a region held between the source line 20a and the ground line 20b, as shown in the figure.

Figure 11:
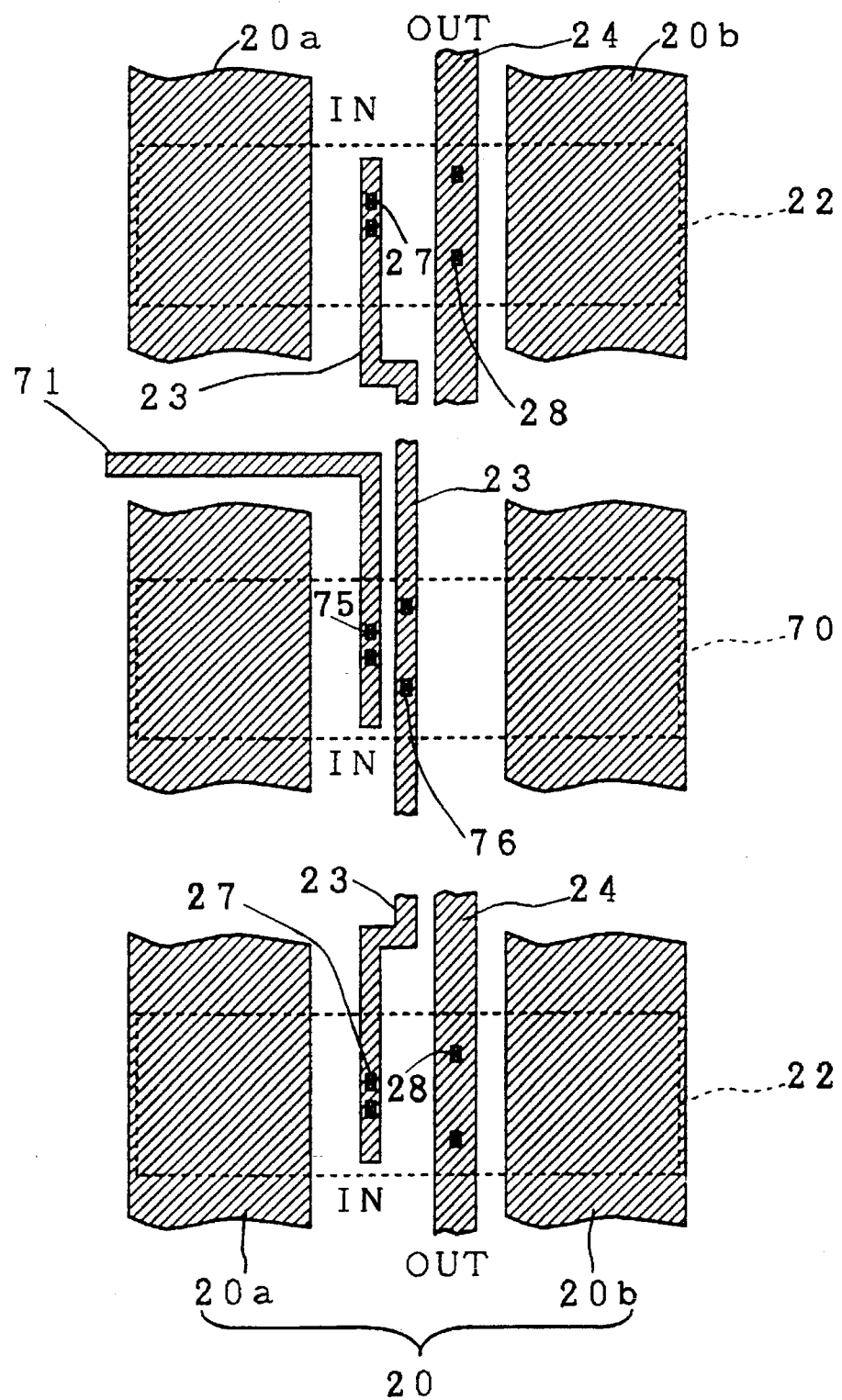
FIG. 11 illustrates connection between the predriver and the main drivers shown in FIG. 9.

Connection between the macro cell 70 and macro cells 22 is shown in FIG. 11. FIG. 11 is a plan view showing a part of FIG. 9 in an enlarged manner. As shown in FIG. 11, the predriver circuit 70 receives clocks through an input signal line 71 which is connected to an input pin thereof. An output of the predriver circuit 70 is outputted through an output signal line 23 which is connected to output pins, to be inputted in the main driver circuits 22 through an input signal line 23 which is connected to input pins of the main driver circuits 22 by through holes 27. Outputs of the main driver circuits 22 are outputted through an output signal line 24.

Although the above embodiment has two main driver circuits, more main driver circuits may be arranged in arbitrary positions located under the source line 20a and the ground line 20b, to attain a similar effect to the above.

Figure 12:
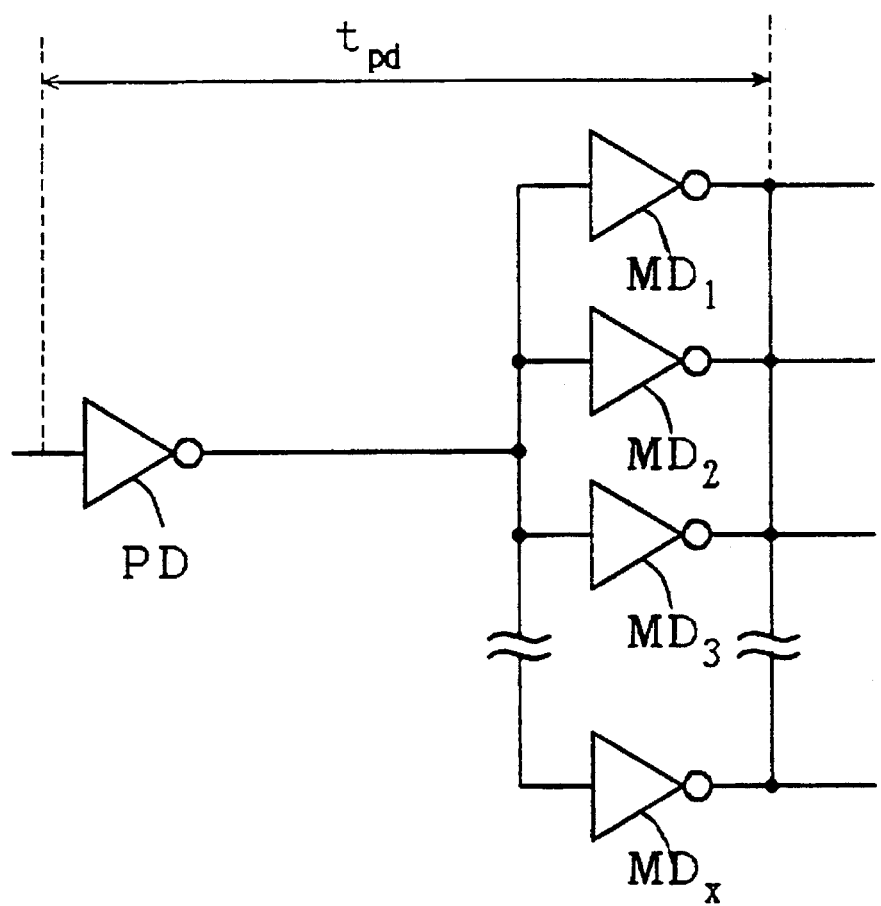
FIG. 12 is a circuit diagram showing a structure of a driver circuit according to a sixth embodiment of the present invention.

Description is now schematically made on a case of providing only main driver circuits under a feeder line and design procedure therefor, with reference to FIGS. 12 to 18. FIG. 12 is a circuit diagram showing connection between a predriver circuit and main driver circuits. Referring to FIG. 12, symbol PD denotes a predriver circuit, and symbols $MD_1$ to $MD_X$ denote main driver circuits having input terminals which are connected in common to an output terminal of the predriver circuit PD and output terminals which are also connected in common. Symbol $t_{pd}$ denotes a delay time of clocks which are inputted in the predriver circuit PD and outputted from the main driver circuits $MD_1$ to $MD_x$.

Figure 13:
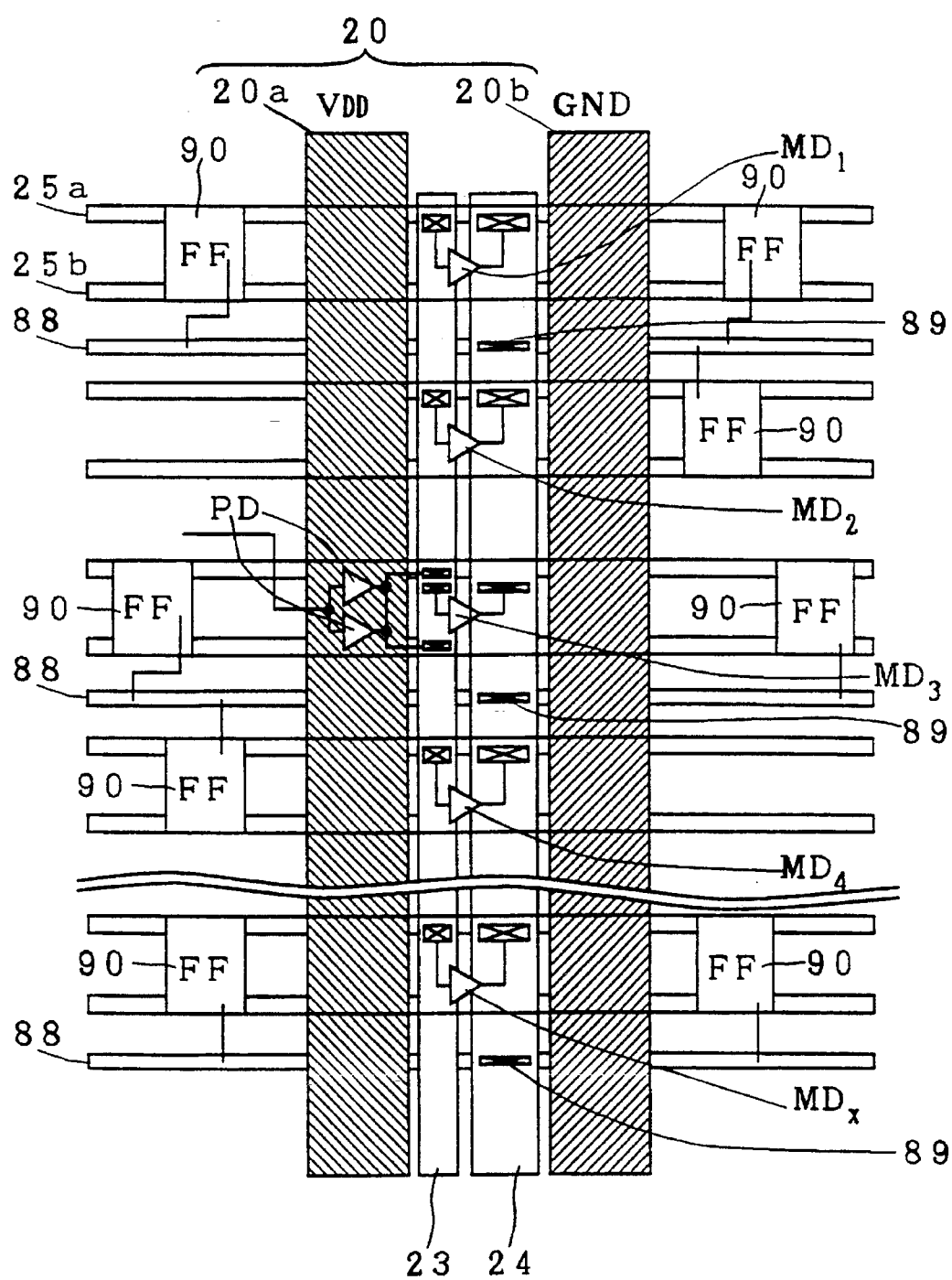
FIG. 13 is a conceptual diagram for illustrating a structure of a semiconductor integrated circuit device comprising the driver circuit shown in FIG. 12.

FIG. 13 illustrates relations between the predriver circuit PD and the main driver circuits $MD_1$ to $MD_X$ shown in FIG. 12 and flip-flop circuits 90 which receive the clocks from the same. The clocks inputted from the predriver circuit PD through an input signal line 23 are distributed to the main driver circuits $MD_1$ to $MD_X$. The clocks outputted from the main driver circuits $MD_1$ to $MD_X$ are distributed to the flip-flop circuits 90 through clock wires 88 of first layer aluminum wires which are connected to the output signal line 24 by through holes 89.

Figure 14:
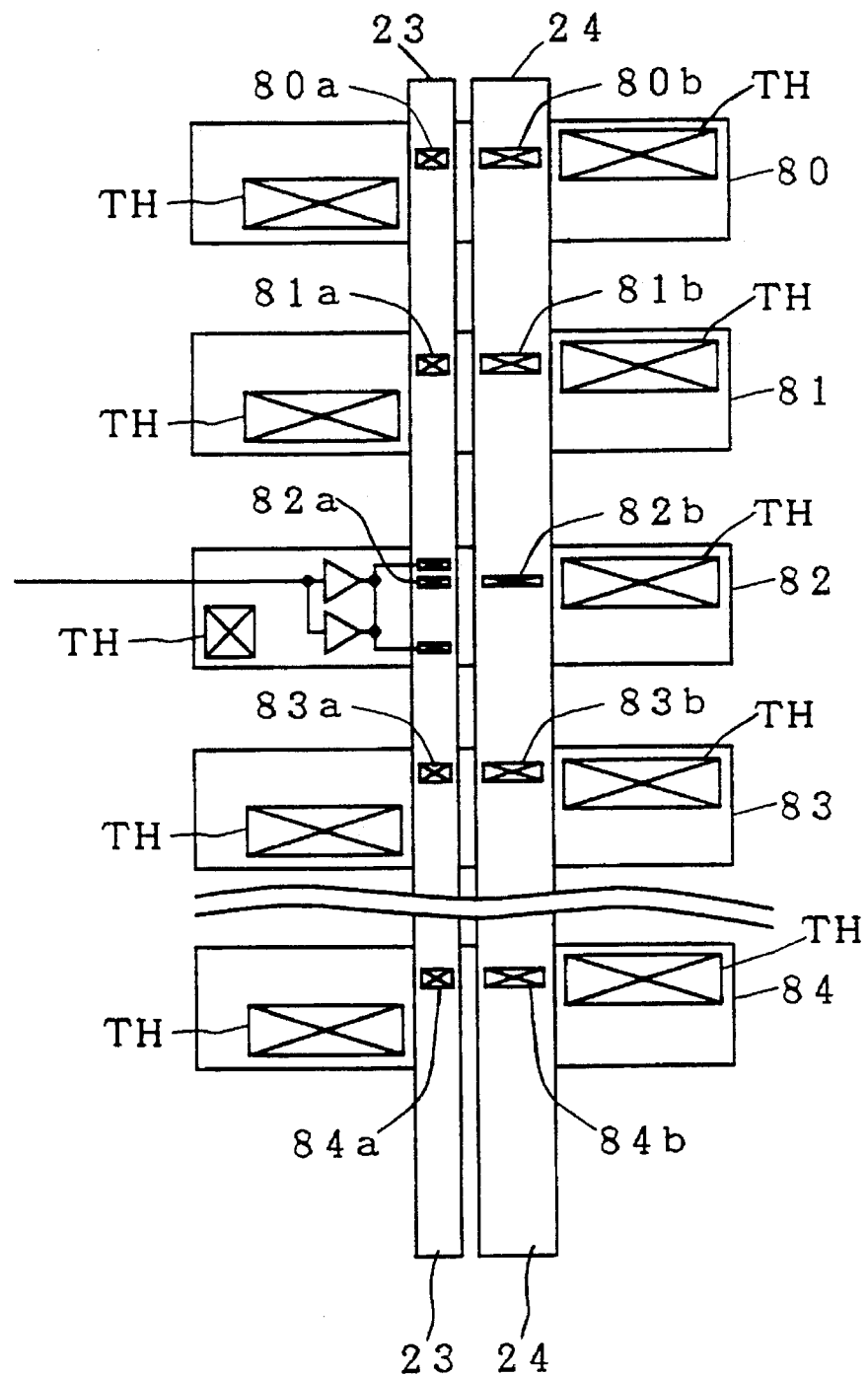
FIG. 14 is a plan view for illustrating a pattern layout of the semiconductor integrated circuit device comprising the driver circuit shown in FIG. 12.

FIG. 14 is a pattern layout diagram showing relation between macro cells serving as clock driver circuits shown in FIG. 13 and input/output signal lines. Numerals 80 to 84 correspond to the main driver circuits $MD_1$ to $MD_X$ shown in FIG. 13. These macro cells 80 to 84 are connected to the feeder line 20 shown in FIG. 13 by through holes TH. The macro cells 80 to 84 are connected with the input signal line 23 in common by through holes 80a to 84a, as well as with the output signal line 24 in common by through holes 80b to 84b respectively.

Figure 15:
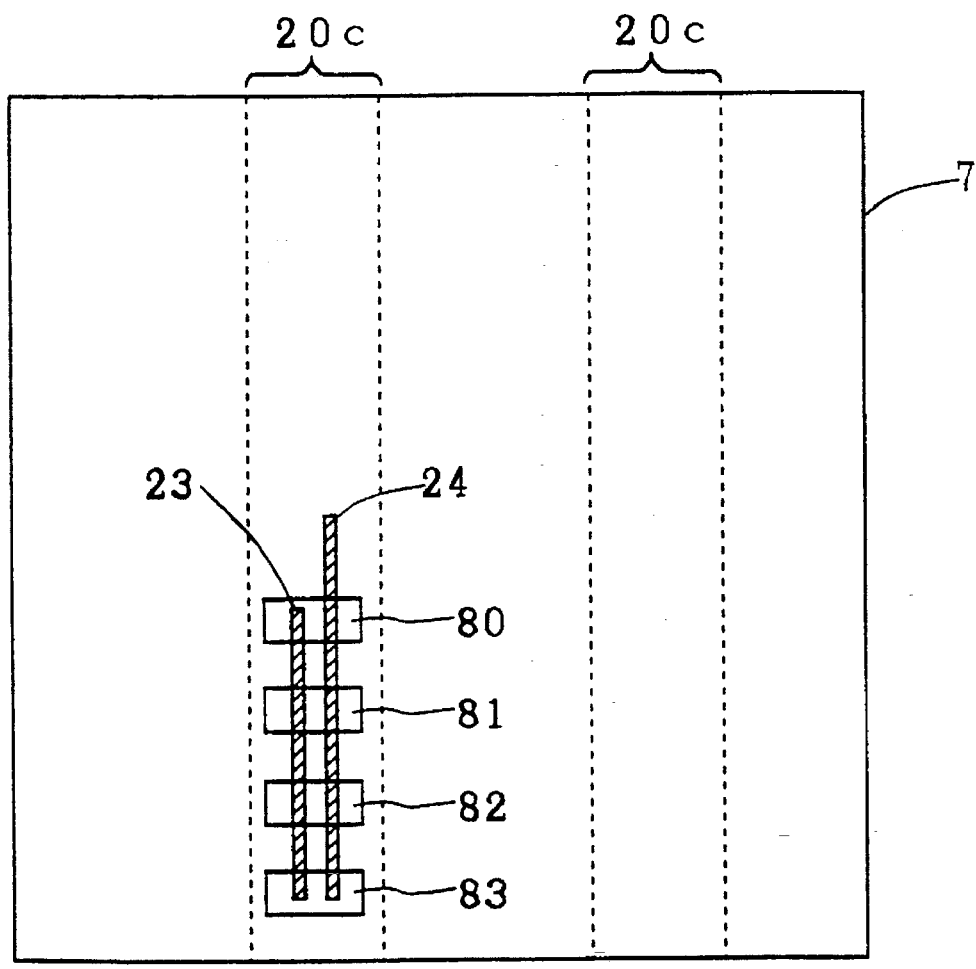
FIG. 15 is a process diagram for illustrating design procedure of the semiconductor integrated circuit device according to the sixth embodiment of the present invention.

A design procedure of the semiconductor integrated circuit device shown in FIG. 13 is now described with reference to FIGS. 15 to 18. First, areas 20c of an internal region 7 to be provided with feeder lines are decided as shown in FIG. 15. Then, the macro cells 80 to 83 as well as the input/output signal lines 23 and 24 are arranged on those of transistor columns (macro cell columns) of the internal region 7 to be distributed with clocks.

Figure 16:
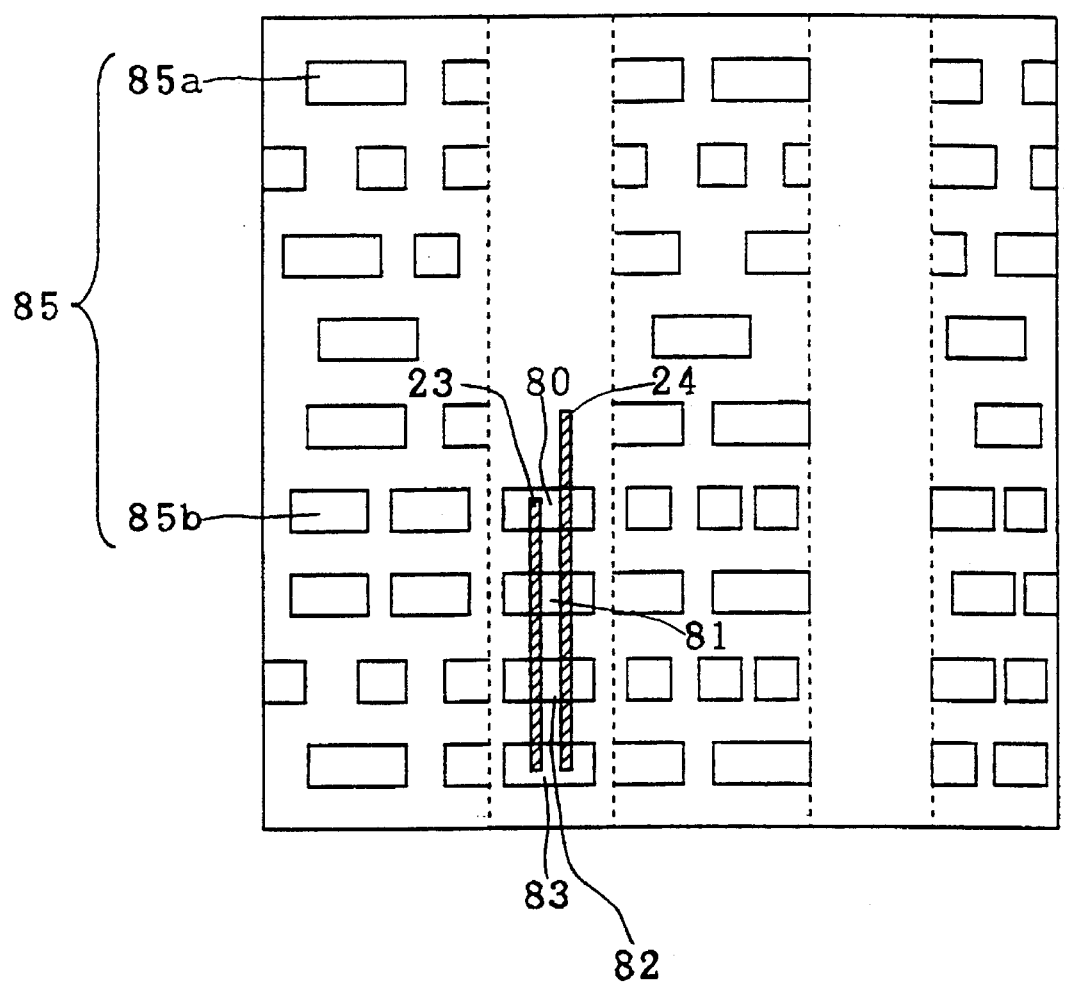
FIG. 16 is a process diagram for illustrating the design procedure of the semiconductor integrated circuit device according to the sixth embodiment of the present invention.
Figure 17:
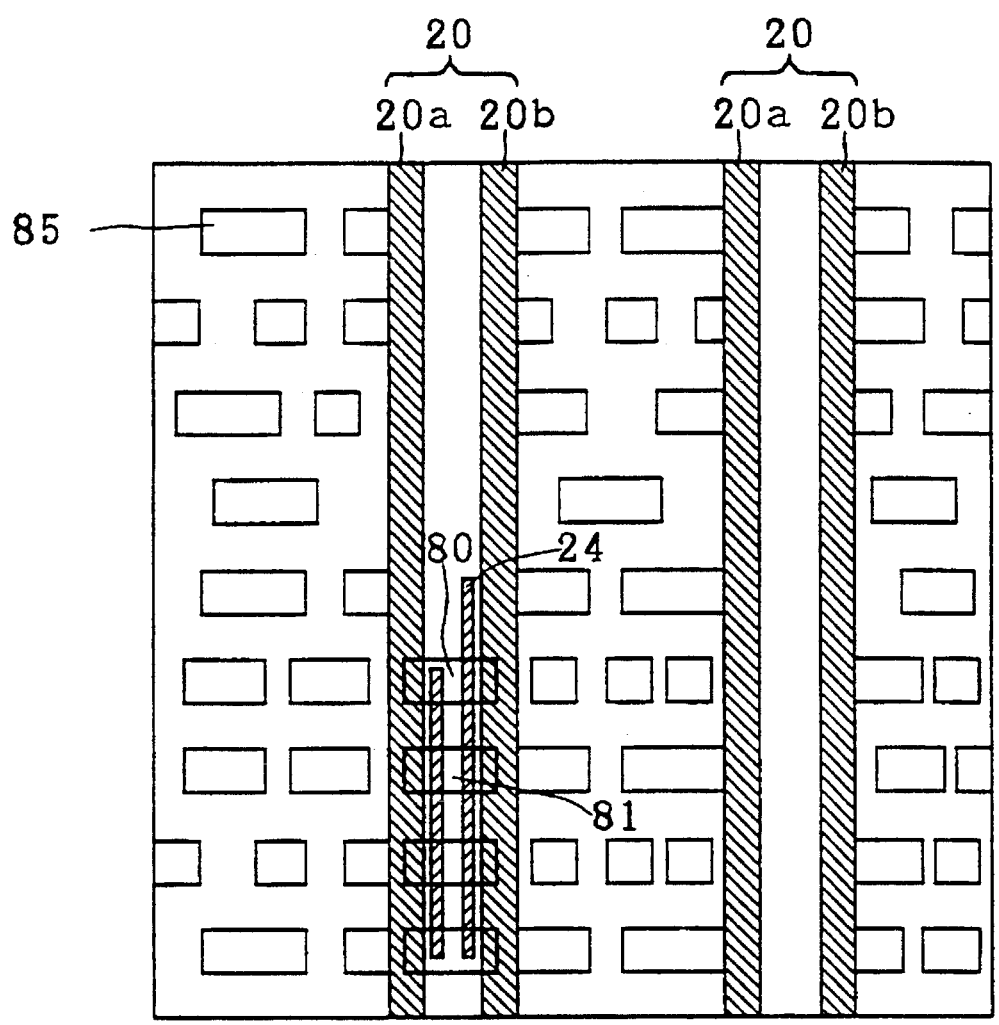
FIG. 17 is a process diagram for illustrating the design procedure of the semiconductor integrated circuit device according to the sixth embodiment of the present invention.

Then, macro cells 85a and 85b are automatically arranged on the transistor columns of the internal region 7 as shown in FIG. 16. The macro cells 85a require no clocks, while the macro cells 85b require clocks. As understood from FIG. 16, the areas 20c to be provided with the feeder lines are those inhibiting arrangement of the macro cells. Then, the feeder lines 20 are wired as shown in FIG. 17.

Figure 18:
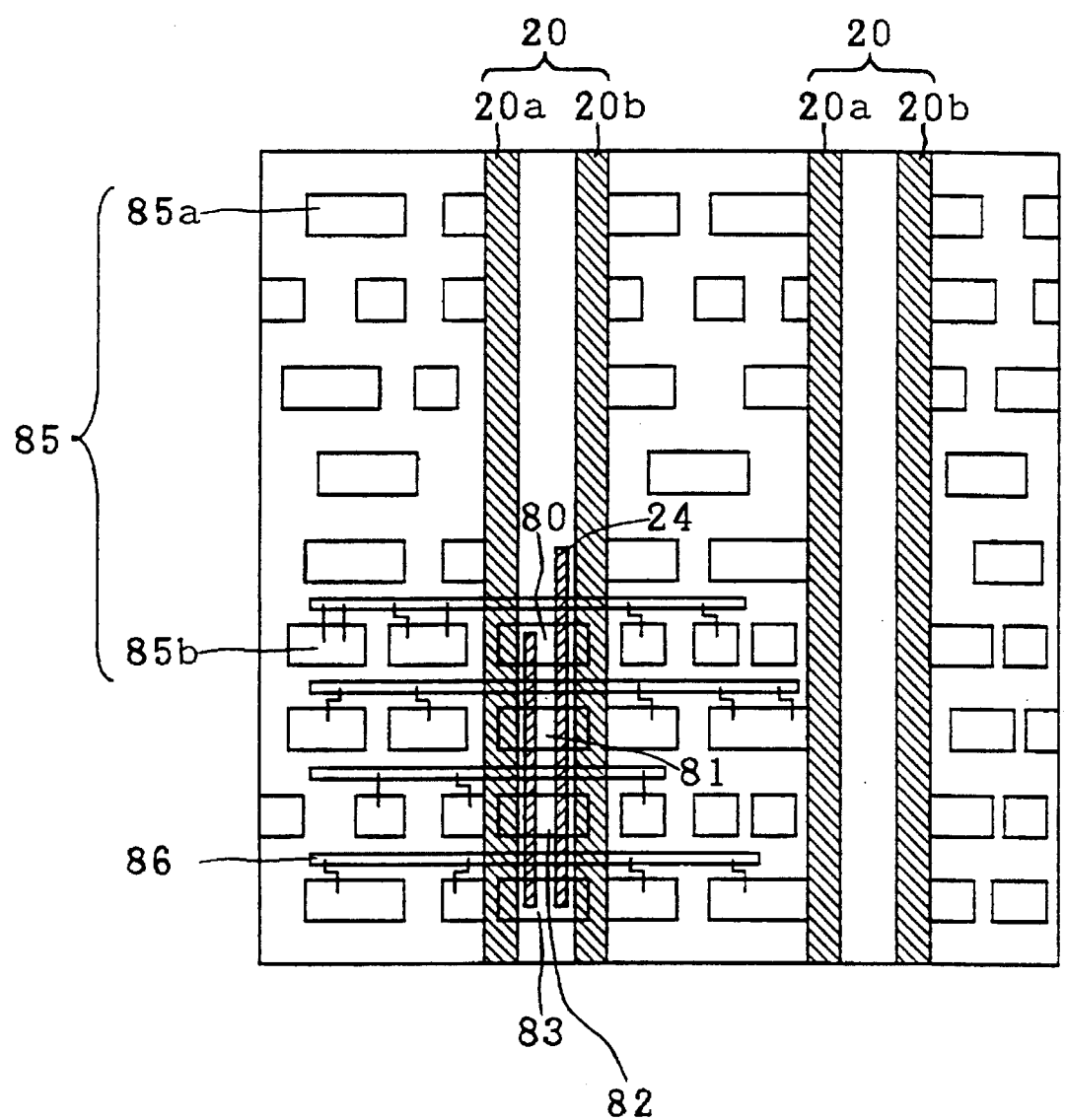
FIG. 18 is a process diagram for illustrating the design procedure of the semiconductor integrated circuit device according to the sixth embodiment of the present invention.
Figure 19A:
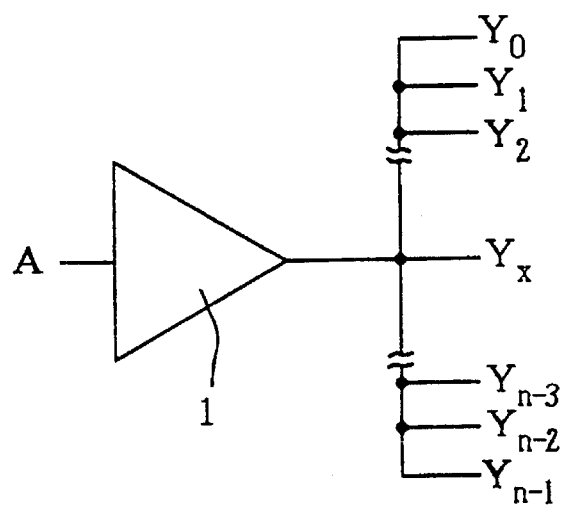
FIGS. 19($a$) and 19($b$) illustrate a structure of a conventional cell having a large fan-out such as a clock driver.
Figure 19B:
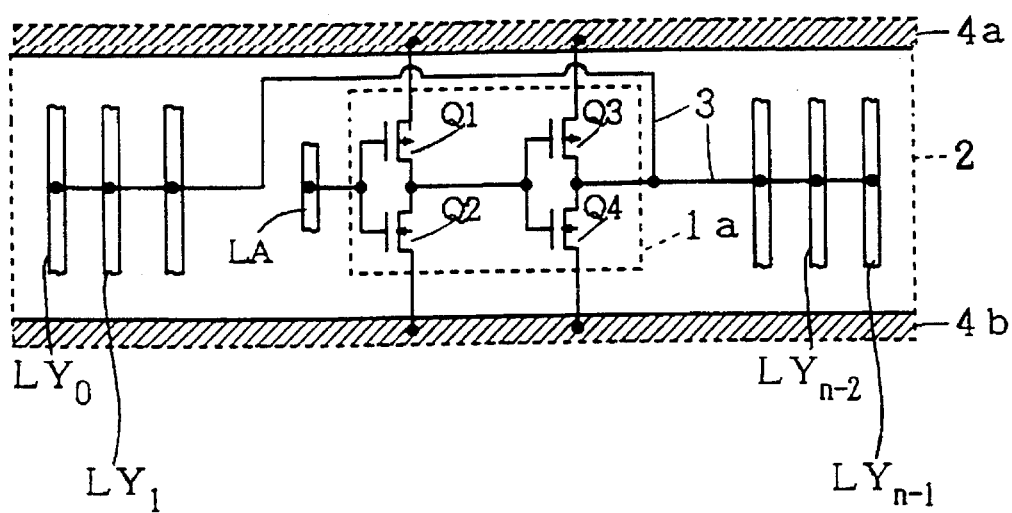
Figure 20A:
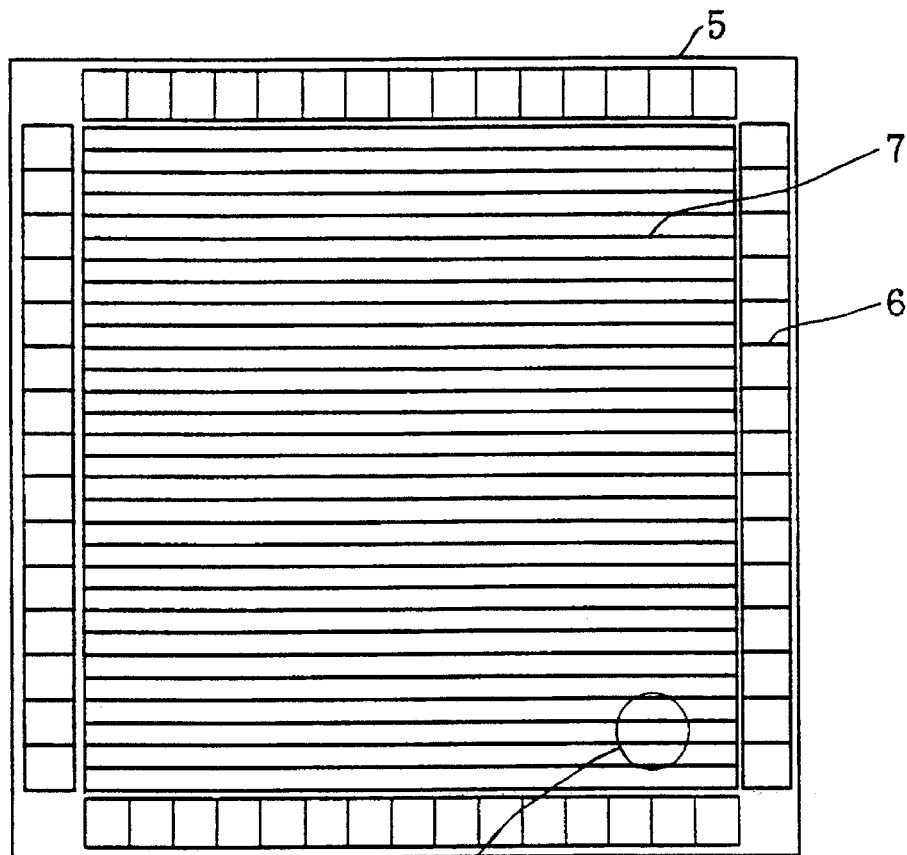
FIGS. 20($a$) and 20($b$) illustrate a structure of a conventional semiconductor integrated circuit device for driving a number of cells using a clock driver having a large fan-out.
Figure 20B:
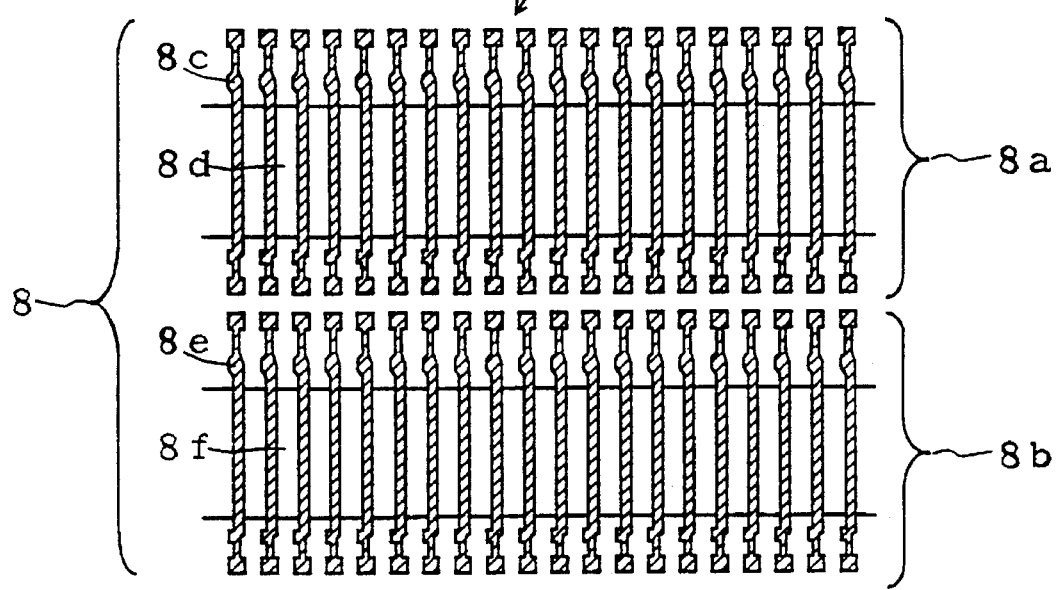
Figure 21A:
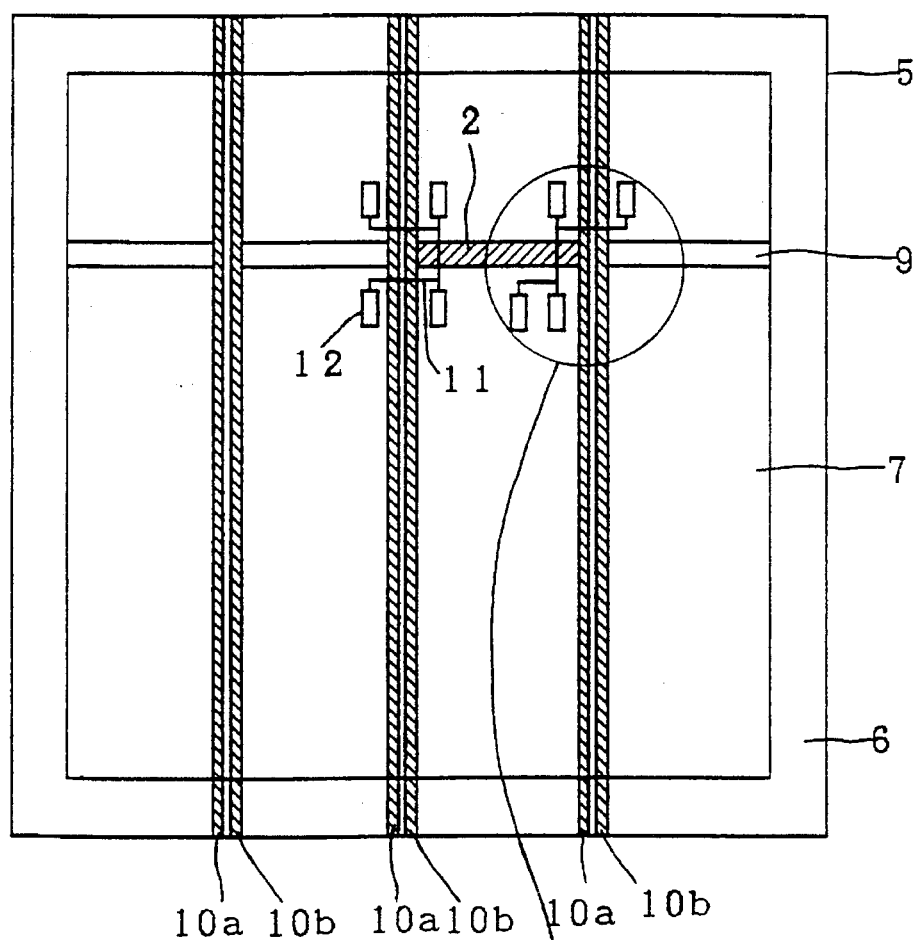
FIGS. 21($a$) and 21($b$) illustrate the structure of the conventional semiconductor integrated circuit device for driving a number of cells using a clock driver having a large fan-out.
Figure 21B:
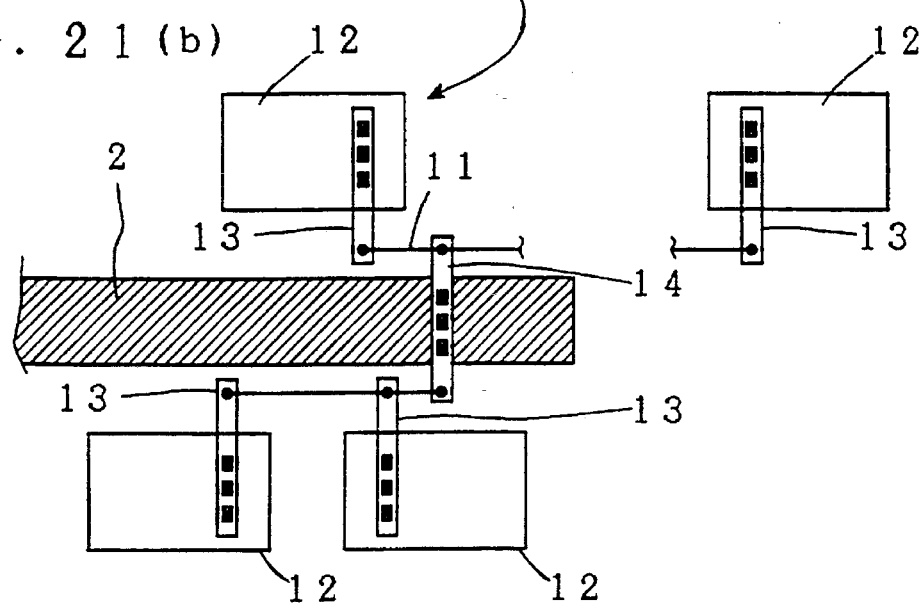

Then, trunks 86 are drawn as signal lines for distributing clocks to the macro cells 85b, as shown in FIG. 18. Finally, wires between the macro cells 85 of the overall chip are automatically arranged.

Although each of the aforementioned embodiments has been described with reference to MOS transistors, regularly arranged transistors forming a macro cell may alternatively be prepared from bipolar transistors, or bipolar transistors and MOS transistors.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit device, comprising:
    a plurality of transistors regularly arranged on a semiconductor substrate;
    at least a set of first and second source lines in a first wiring layer for supplying said plurality of transistors with voltages for driving said transistors, said at least a set of first and second source lines arranged along a line of a gate array of the semiconductor integrated circuit device;
    third and fourth source lines, arranged in parallel, along different lines, along side of each other, larger in width than said first and second source lines, arranged in a second wiring layer which is different from said first wiring layer, in alignment with each other to intersect with said first and second source lines in a grade separation manner, said third and fourth source lines arranged in a line across a plurality of cell columns of the semiconductor integrated circuit device, and the third and fourth source lines intersect each cell column in three-dimensional space but are separated from the cell columns;
    at least one macro cell utilizing those of said transistors, including a driver circuit which is located under at least one of a region between said third and fourth source lines, and both of said third and fourth source lines; and
    an output signal line in a portion of said second wiring layer between said third and fourth source lines for transmitting an output signal of said at least one macro cell.

2. A semiconductor integrated circuit device in accordance with claim 1, wherein said driver circuit includes a predriver circuit and said macro cell includes a plurality of main driver circuits being provided in a portion which is substantially symmetrical with regard to said predriver circuit under at least one of a region between said third and fourth source lines, and both of said third and fourth source lines.

* * * * *